United States Patent
Ohki

(10) Patent No.: US 9,093,512 B2
(45) Date of Patent: Jul. 28, 2015

(54) COMPOUND SEMICONDUCTOR DEVICE

(75) Inventor: Toshihiro Ohki, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 13/325,917

(22) Filed: Dec. 14, 2011

(65) Prior Publication Data

US 2012/0217544 A1 Aug. 30, 2012

(30) Foreign Application Priority Data

Feb. 24, 2011 (JP) ................... 2011-037900

(51) Int. Cl.
| | | |
|---|---|---|
| *H01L 29/778* | (2006.01) | |
| *H01L 29/40* | (2006.01) | |
| *H01L 29/66* | (2006.01) | |
| *H01L 29/20* | (2006.01) | |
| *H01L 29/423* | (2006.01) | |
| *H01L 29/51* | (2006.01) | |

(52) U.S. Cl.
CPC .......... *H01L 29/7787* (2013.01); *H01L 29/402* (2013.01); *H01L 29/405* (2013.01); *H01L 29/408* (2013.01); *H01L 29/66462* (2013.01); *H01L 29/2003* (2013.01); *H01L 29/42356* (2013.01); *H01L 29/42376* (2013.01); *H01L 29/517* (2013.01)

(58) Field of Classification Search
CPC .................................................... H01L 29/402
USPC ............ 257/194, E29.246, 76, 409, E29.068, 257/E29.242, 476, E27.009
See application file for complete search history.

(56) References Cited

U.S. PATENT DOCUMENTS

| | | | | |
|---|---|---|---|---|
| 5,510,634 A | * | 4/1996 | Okabe et al. ................... | 257/139 |
| 6,100,571 A | * | 8/2000 | Mizuta et al. .................. | 257/488 |
| 6,664,593 B2 | * | 12/2003 | Peake ............................ | 257/336 |
| 7,002,189 B2 | | 2/2006 | Kikkawa | |
| 7,256,432 B2 | * | 8/2007 | Okamoto et al. .............. | 257/192 |
| 7,388,236 B2 | * | 6/2008 | Wu et al. ....................... | 257/194 |

(Continued)

FOREIGN PATENT DOCUMENTS

| | | |
|---|---|---|
| CN | 101075638 A | 11/2007 |
| JP | 2002-359256 | 12/2002 |

(Continued)

OTHER PUBLICATIONS

CNOA—Office Action of Chinese Patent Application 201210007524.4 dated Jul. 14, 2014, with full English-language Translation.

(Continued)

*Primary Examiner* — Yu-Hsi D Sun
*Assistant Examiner* — Ankush Singal
(74) *Attorney, Agent, or Firm* — Fujitsu Patent Center

(57) ABSTRACT

A compound semiconductor device includes a nitride semiconductor stacked structure including a carrier transit layer and a carrier supply layer; a source electrode and a drain electrode provided over the nitride semiconductor stacked structure; a gate electrode provided between the source electrode and the drain electrode, over the nitride semiconductor stacked structure; a field plate provided at least partially between the gate electrode and the drain electrode; and a plurality of insulation films and formed over the nitride semiconductor stacked structure, wherein a number of interfaces of the plurality of insulation films is smaller between the field plate and the drain electrode than in the vicinity of the gate electrode.

10 Claims, 13 Drawing Sheets

(56) References Cited

U.S. PATENT DOCUMENTS

| | | | |
|---|---|---|---|
| 7,573,078 B2 * | 8/2009 | Wu et al. ................. 257/194 |
| 7,745,849 B2 * | 6/2010 | Briere ..................... 257/192 |
| 7,863,648 B2 * | 1/2011 | Miyamoto et al. ........ 257/192 |
| 7,893,500 B2 * | 2/2011 | Wu et al. ................. 257/367 |
| 8,030,686 B2 | 10/2011 | Ohki |
| 8,134,182 B2 * | 3/2012 | Nomoto ................... 257/194 |
| 8,354,726 B2 | 1/2013 | Tsutsui |
| 2002/0171096 A1 * | 11/2002 | Wakejima et al. ........ 257/280 |
| 2004/0021175 A1 * | 2/2004 | Brech ...................... 257/340 |
| 2004/0144991 A1 * | 7/2004 | Kikkawa .................. 257/103 |
| 2004/0173860 A1 * | 9/2004 | Uryuu et al. ............. 257/411 |
| 2005/0110042 A1 | 5/2005 | Saito et al. |
| 2005/0253168 A1 * | 11/2005 | Wu et al. ................. 257/192 |
| 2006/0043415 A1 * | 3/2006 | Okamoto et al. ......... 257/192 |
| 2006/0102929 A1 * | 5/2006 | Okamoto et al. ......... 257/189 |
| 2006/0202272 A1 * | 9/2006 | Wu et al. ................. 257/355 |
| 2007/0200195 A1 * | 8/2007 | Tanaka et al. ............ 257/492 |
| 2007/0228422 A1 * | 10/2007 | Suzuki et al. ............ 257/213 |
| 2007/0235775 A1 * | 10/2007 | Wu et al. ................. 257/288 |
| 2007/0249119 A1 * | 10/2007 | Saito ....................... 438/253 |
| 2007/0267707 A1 | 11/2007 | Tsutsui |
| 2009/0032879 A1 * | 2/2009 | Kuraguchi ............... 257/368 |
| 2009/0140262 A1 | 6/2009 | Ohki et al. |
| 2009/0189205 A1 * | 7/2009 | Ohki ....................... 257/288 |
| 2009/0230430 A1 * | 9/2009 | Miyamoto et al. ........ 257/192 |
| 2009/0242937 A1 * | 10/2009 | Marui et al. ............. 257/192 |
| 2009/0267116 A1 * | 10/2009 | Wu et al. ................. 257/194 |
| 2010/0044752 A1 * | 2/2010 | Marui ...................... 257/192 |
| 2010/0102358 A1 * | 4/2010 | Lanzieri et al. ........... 257/194 |
| 2010/0155720 A1 * | 6/2010 | Kaneko .................... 257/43 |
| 2010/0201439 A1 * | 8/2010 | Wu et al. ................. 327/581 |
| 2011/0260777 A1 * | 10/2011 | Suzuki et al. ............ 327/493 |
| 2012/0018735 A1 * | 1/2012 | Ishii ........................ 257/76 |
| 2012/0032188 A1 | 2/2012 | Kanamura et al. |
| 2012/0091508 A1 * | 4/2012 | Aoki ....................... 257/194 |
| 2012/0235160 A1 * | 9/2012 | Heikman et al. .......... 257/76 |
| 2014/0038372 A1 | 2/2014 | Kanamura et al. |

FOREIGN PATENT DOCUMENTS

| | | |
|---|---|---|
| JP | 2008-277640 | 11/2008 |
| JP | 4179539 | 11/2008 |
| JP | 2009-182069 | 8/2009 |
| JP | 2010-010489 | 1/2010 |
| JP | 2010-147349 | 7/2010 |
| JP | 2010-251456 | 11/2010 |
| WO | 2010/122628 A1 | 10/2010 |

OTHER PUBLICATIONS

Office Action of Chinese Patent Application 201210007524.4 dated Jan. 24, 2014, with English Translation.

TWOA—Office Action of Taiwanese Patent Application No. 100145010 dated Nov. 19, 2014, with partial English translation of the Office Action.

JPOA—Office Action of Japanese Patent Application No. 2011-037900 dated Dec. 2, 2014, with partial English translation.

* cited by examiner

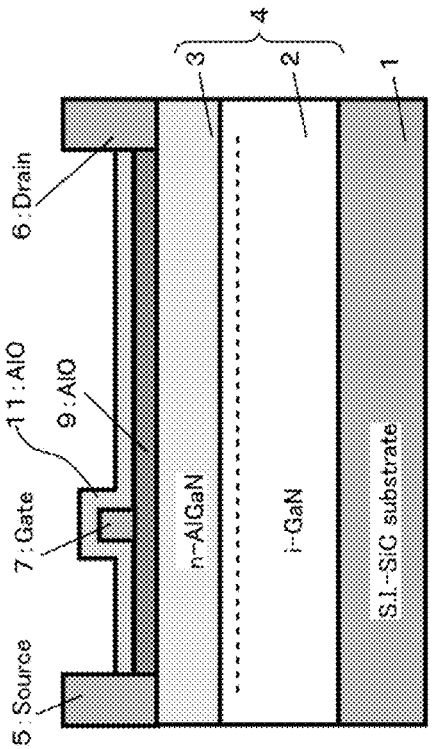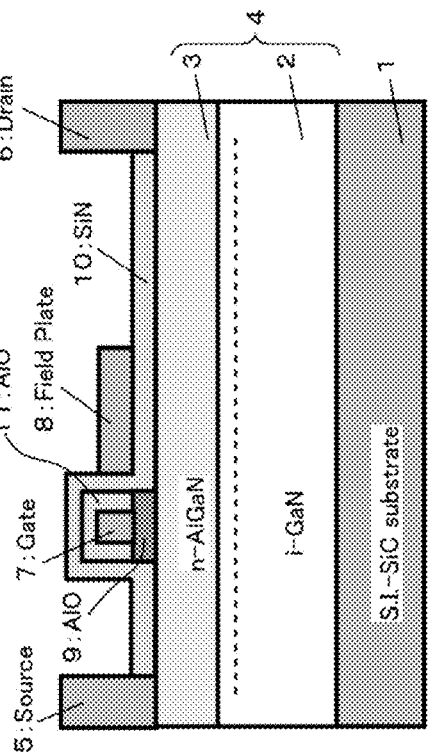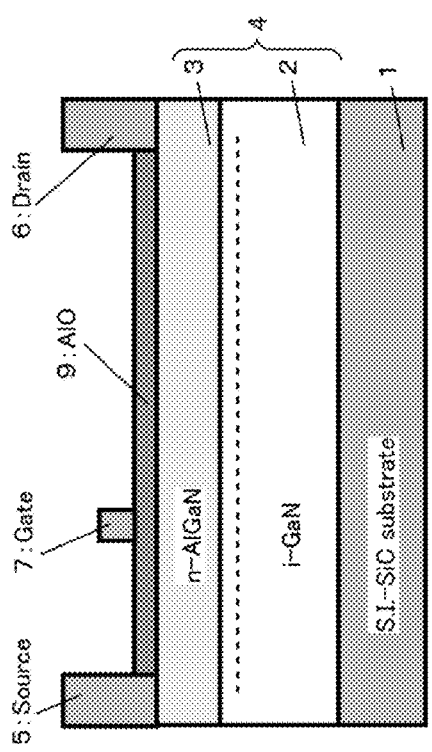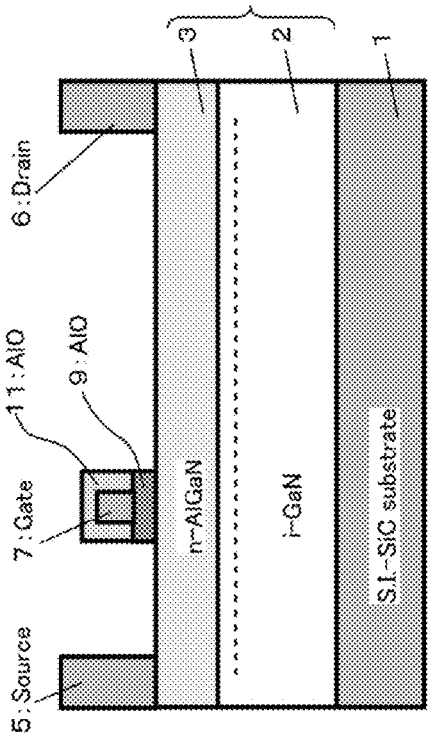

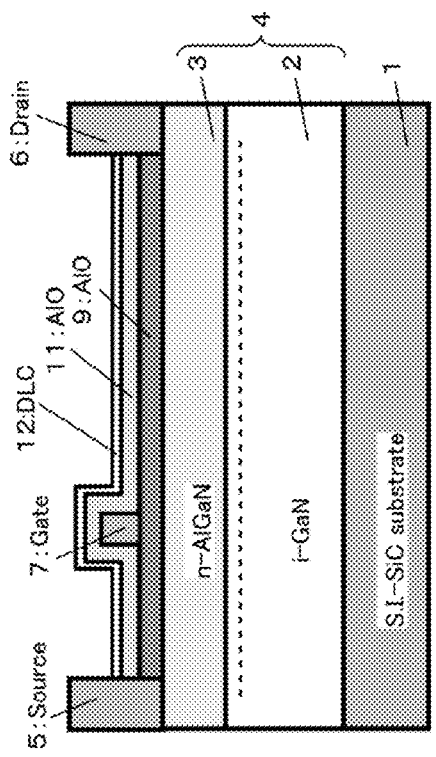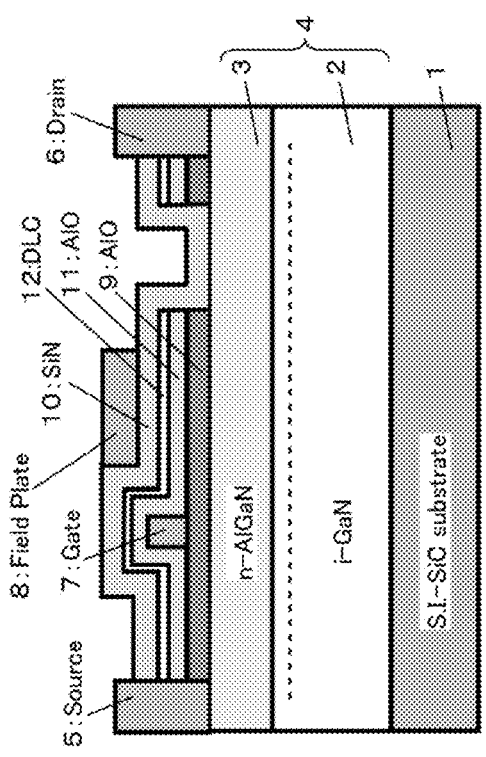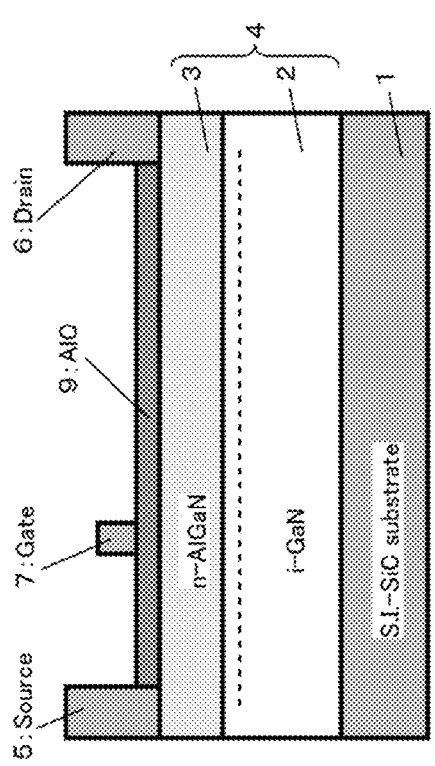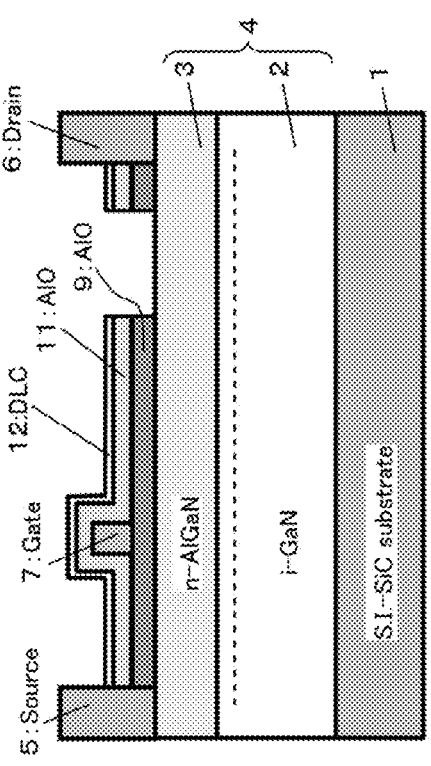

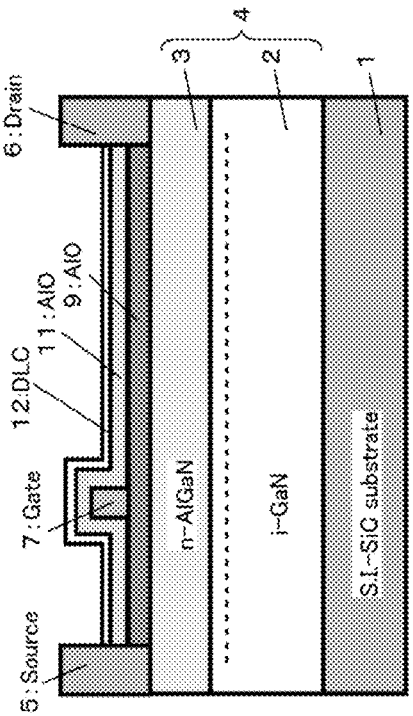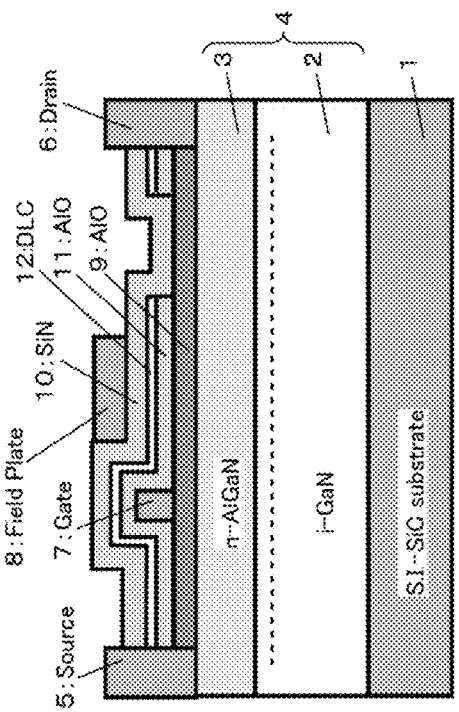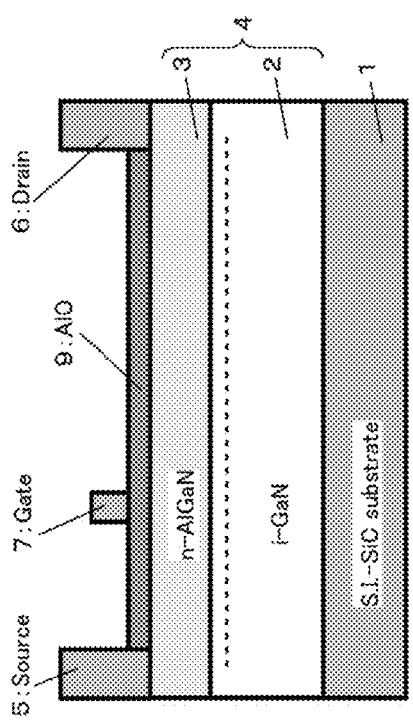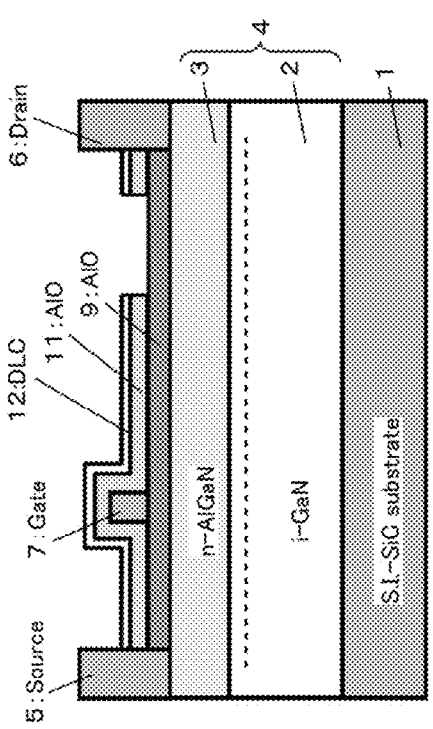

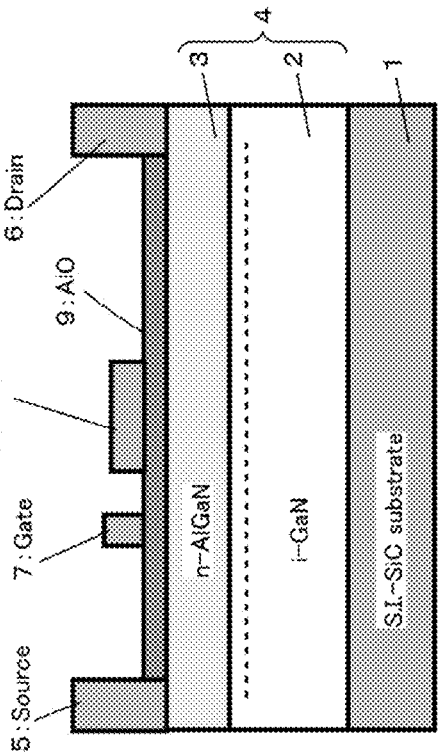
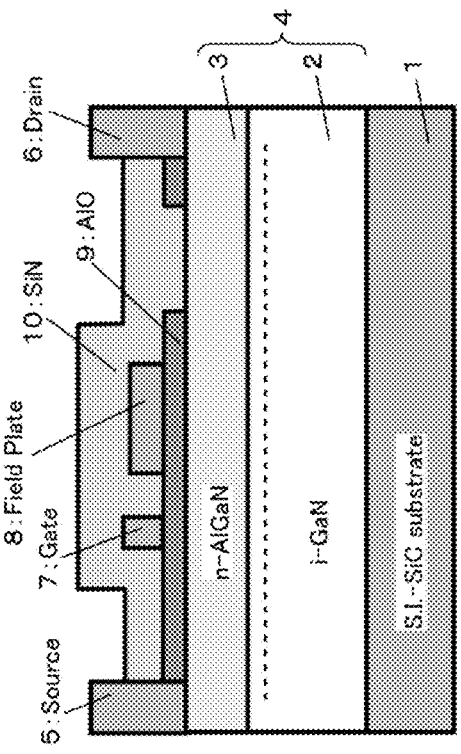
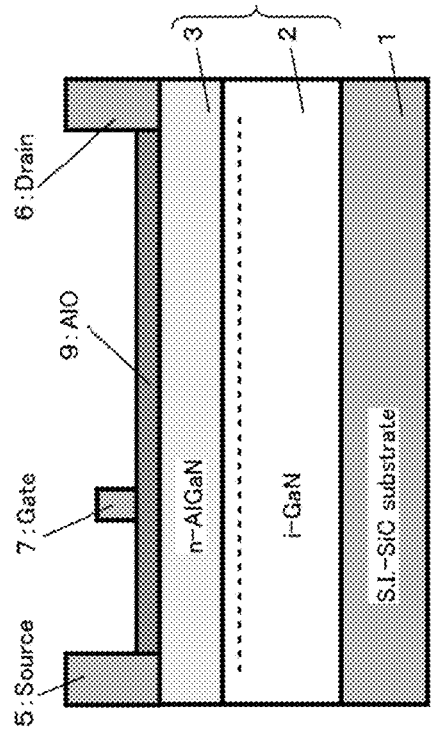
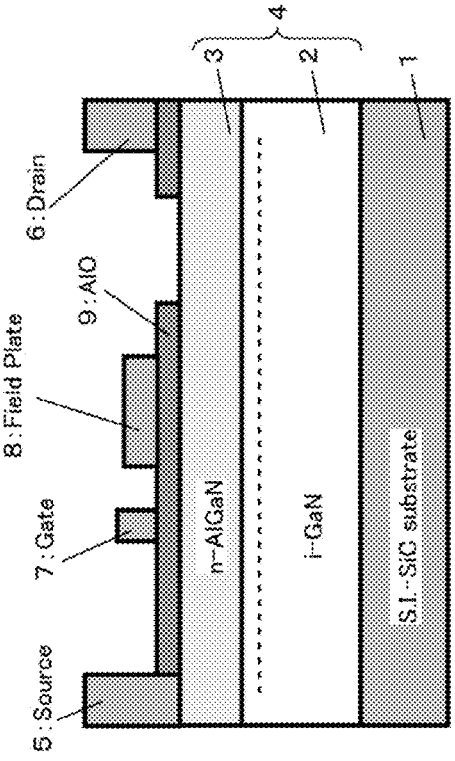

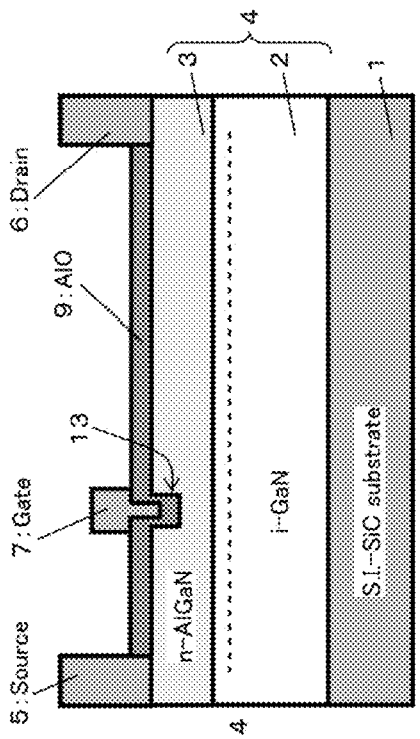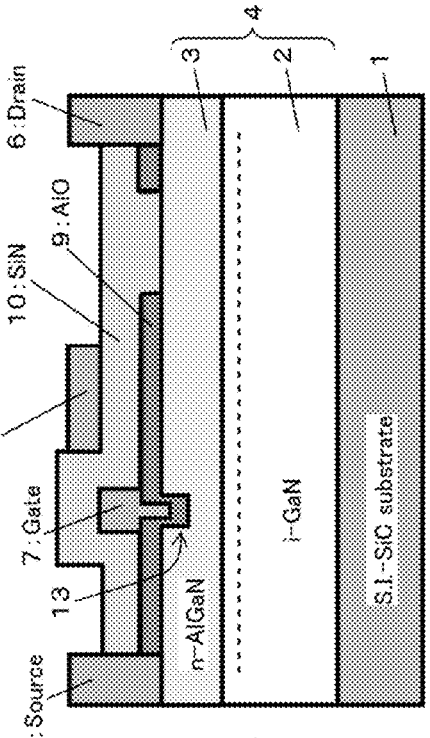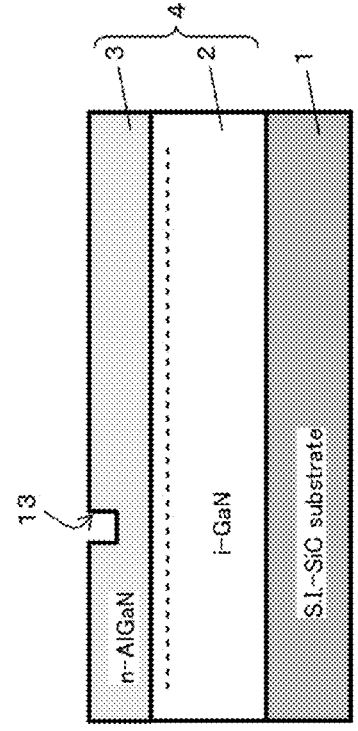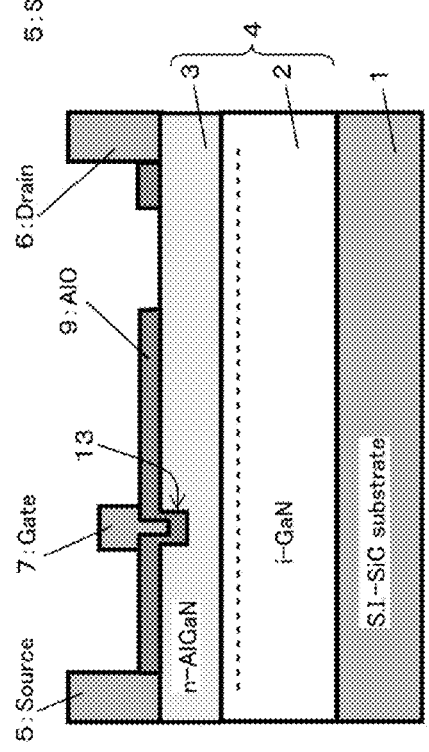

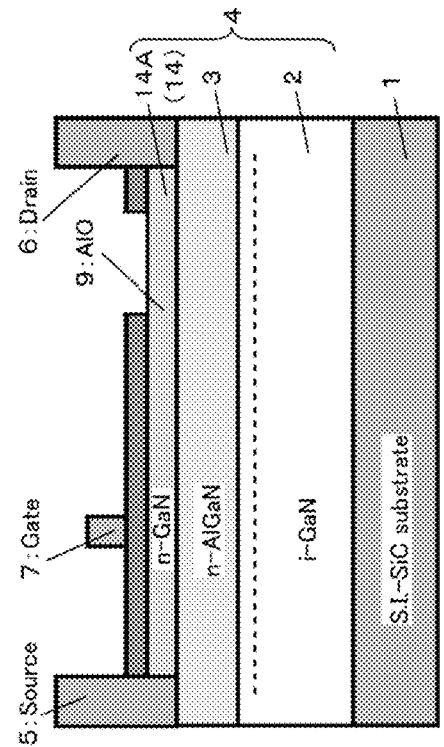
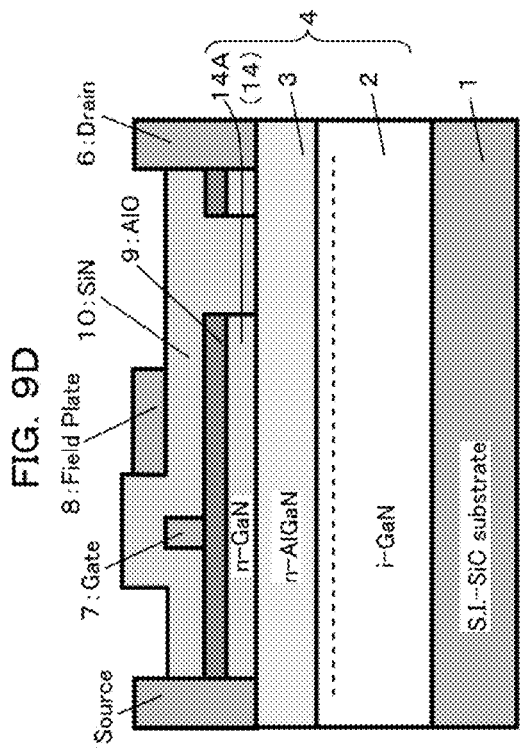
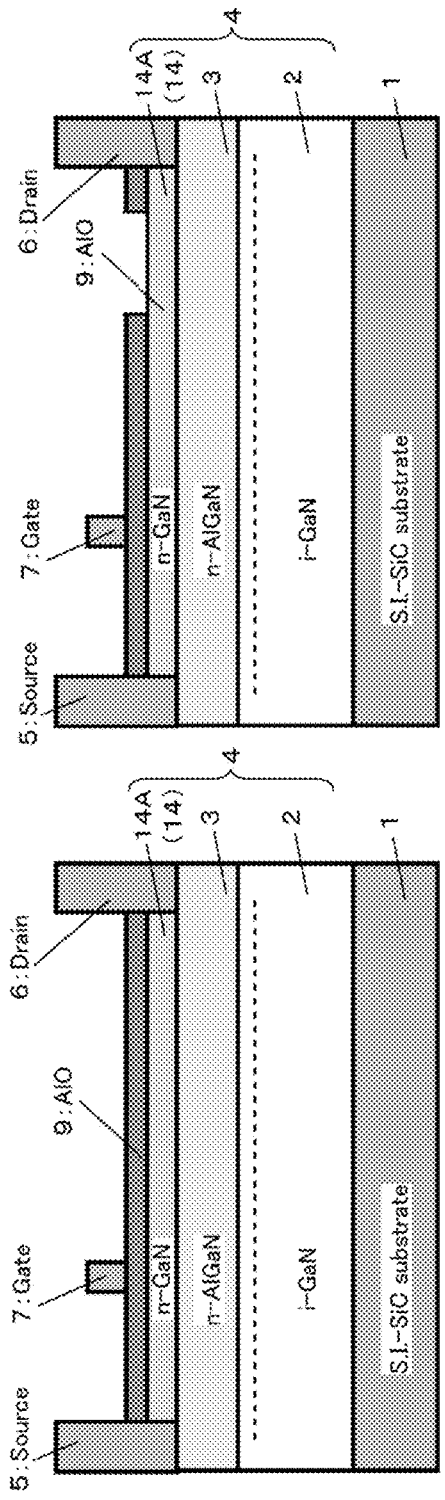
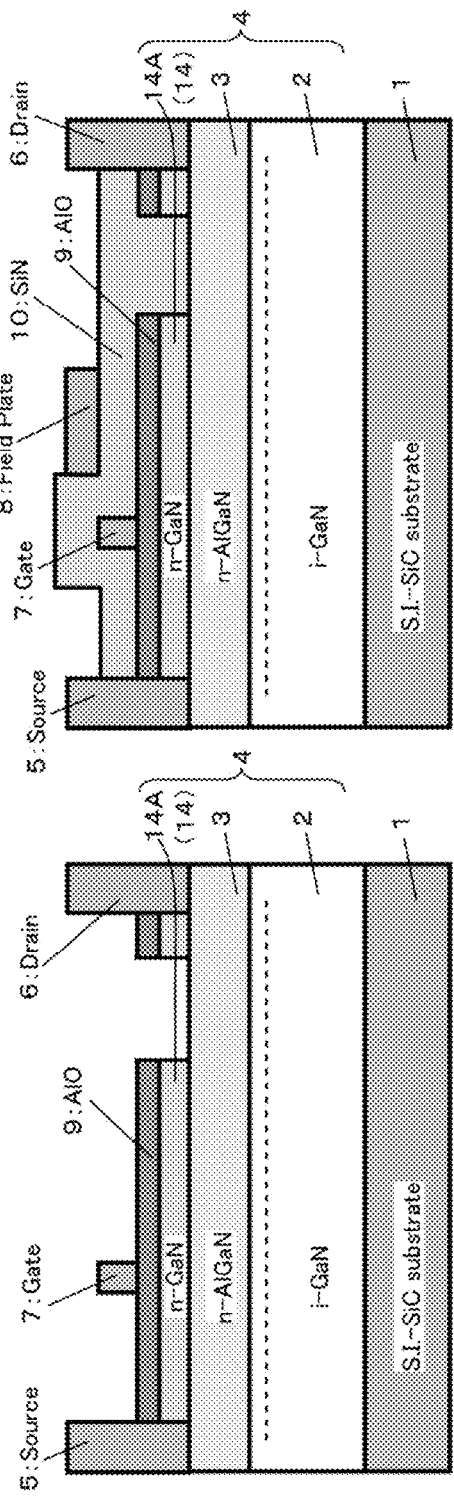

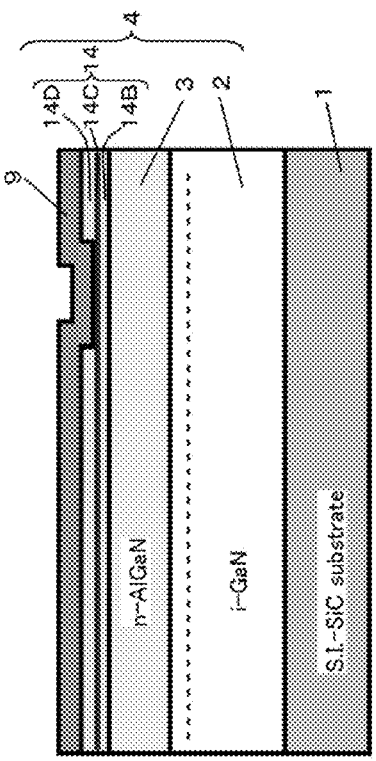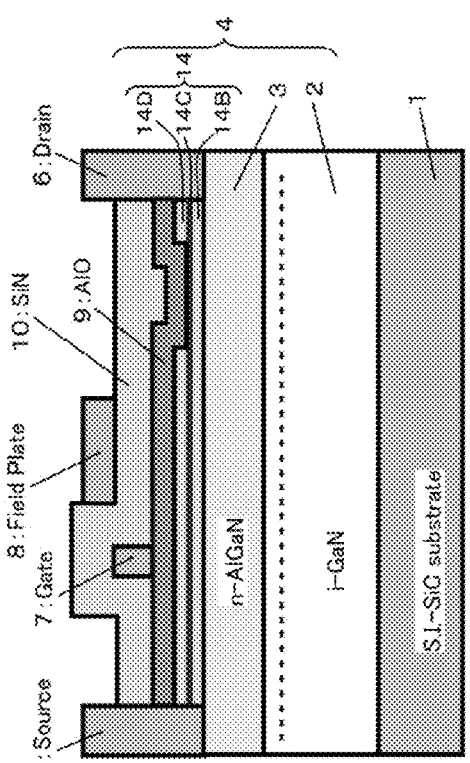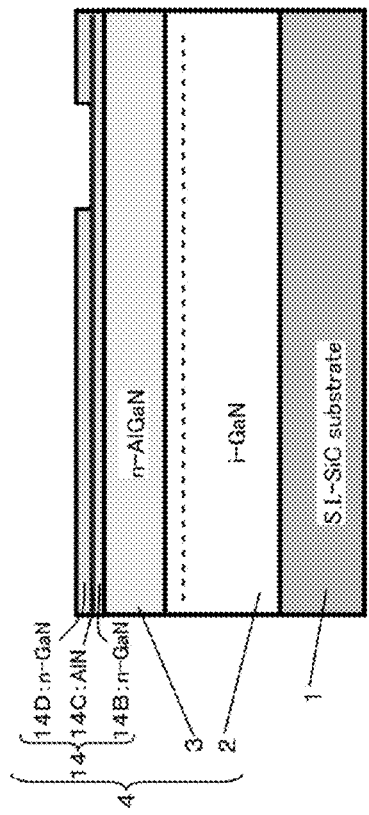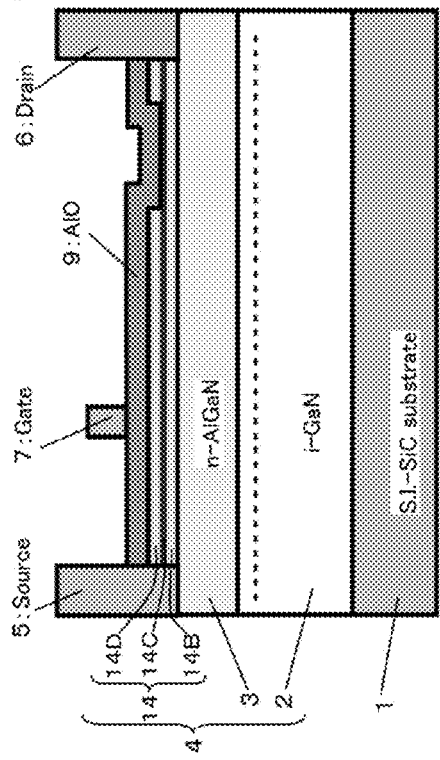
FIG. 12A
FIG. 12B
FIG. 12C
FIG. 12D

COMPOUND SEMICONDUCTOR DEVICE

CROSS-REFERENCE TO RELATED APPLICATION

This application is based upon and claims the benefit of priority of the prior Japanese Patent Application No. 2011-037900, filed on Feb. 24, 2011, the entire contents of which are incorporated herein by reference.

FIELD

The present embodiments discussed herein are related to a compound semiconductor device.

BACKGROUND

Compound semiconductor device have been known, wherein source, drain, and gate electrodes are formed over a compound semiconductor stacked structure.

Particularly, semiconductor devices made from nitride semiconductors, typically GaN, AlN, InN, and mixed crystals thereof, have become a focus of attention as higher-output electronic devices and shorter-wavelength light-emitting devices, for their superior material properties.

Field-effect transistors, particularly high electron mobility transistors (HEMTs), have been researched and developed in recent years as candidate higher-output electronic devices, and their applications to higher-output and highly-efficient amplifiers, high-power switching devices, and the like, have been sought for.

SUMMARY

Hence, the present compound semiconductor device includes a nitride semiconductor stacked structure including a carrier transit layer and a carrier supply layer; a source electrode and a drain electrode provided over the nitride semiconductor stacked structure; a gate electrode provided between the source electrode and the drain electrode, over the nitride semiconductor stacked structure; a field plate provided at least partially between the gate electrode and the drain electrode; and a plurality of insulation films formed over the nitride semiconductor stacked structure, wherein a number of interfaces of the plurality of insulation films is smaller between the field plate and the drain electrode than in the vicinity of the gate electrode.

Furthermore, the present compound semiconductor device includes a nitride semiconductor stacked structure including a carrier transit layer and a carrier supply layer; a source electrode and a drain electrode provided over the nitride semiconductor stacked structure; a gate electrode provided between the source electrode and the drain electrode, over the nitride semiconductor stacked structure; a field plate provided at least partially between the gate electrode and the drain electrode; and a plurality of insulation films formed over the nitride semiconductor stacked structure, wherein a film thickness of an insulation film of the plurality of insulation films, which is located between the field plate and the drain electrode and contacts the nitride semiconductor stacked structure, is greater than a total film thickness of insulation films located between the field plate and the nitride semiconductor stacked structure.

Furthermore, the present compound semiconductor device includes a nitride semiconductor stacked structure including a carrier transit layer, a carrier supply layer, and a cap layer; a source electrode and a drain electrode provided over the nitride semiconductor stacked structure; a gate electrode provided between the source electrode and the drain electrode, over the nitride semiconductor stacked structure; a field plate provided at least partially between the gate electrode and the drain electrode; and a plurality of insulation films formed over the nitride semiconductor stacked structure, wherein the cap layer is made thinner between the field plate and the drain electrode than in the vicinity of the gate electrode.

The object and advantages of the invention will be realized and attained by means of the elements and combinations particularly pointed out in the claims. It is to be understood that both the foregoing general description and the following detailed description are exemplary and explanatory and are not restrictive of the invention, as claimed.

BRIEF DESCRIPTION OF THE DRAWINGS

FIGS. 4A to 4D are schematic cross-sectional views illustrating the structure of a compound semiconductor device according to a variant of the first embodiment and a method of manufacturing the same;

FIGS. 5A to 5D are schematic cross-sectional views illustrating the structure of a compound semiconductor device and a method of manufacturing the same according to a second embodiment;

FIGS. 6A to 6D are schematic cross-sectional views illustrating the structure of a compound semiconductor device and a method of manufacturing the same according to a third embodiment;

FIGS. 7A to 7D are schematic cross-sectional views illustrating the structure of a compound semiconductor device and a method of manufacturing the same according to a fourth embodiment;

FIGS. 8A to 8D are schematic cross-sectional views illustrating the structure of a compound semiconductor device and a method of manufacturing the same according to a fifth embodiment;

FIGS. 9A to 9D are schematic cross-sectional views illustrating the structure of a compound semiconductor device and a method of manufacturing the same according to a sixth embodiment;

FIGS. 12A to 12D are schematic cross-sectional views illustrating a compound semiconductor device and a method of manufacturing the same according to a variant of the seventh embodiment.

DESCRIPTION OF EMBODIMENTS

In applications to power devices, satisfying two contradictory characteristics, namely, a higher breakdown withstanding voltage and a lower on-resistance, is essential.

One strategy for attaining this goal is provision of field plates. Field plates can alleviate the electric field intensity applied on the end of a gate electrode, thereby increasing the withstanding voltage, as well as suppressing current collapse. As used herein, the term "current collapse" refers to a phenomenon wherein the on-resistance increases, and the drain current decreases during a higher voltage operation. Hence, field plates can suppress current collapse, i.e., reduce the on-resistance, as well as improving the withstanding voltage.

The withstanding voltage can be further improved in devices including field plates, by increasing the distance between a gate electrode or field plate and a drain electrode. A longer distance may, in turn, deteriorate current collapse, resulting in a higher on-resistance.

Accordingly, a compound semiconductor device is desired, wherein the withstanding voltage is improved while suppressing any increase in the on-resistance, thereby achieving the two contradictory characteristics of a higher withstanding voltage and lower on-resistance.

Hereinafter, a compound semiconductor device according to embodiments will be described with reference to the drawings.

First Embodiment

A compound semiconductor device according to a first embodiment will be described with reference to FIGS. 1 and 2A to 2D.

The compound semiconductor device according to the present embodiment is a metal insulator semiconductor (MIS)-type transistor including a gate insulation film.

Here, a field-effect transistor using a nitride semiconductor, specifically, a high electron mobility transistor using gallium nitride (GaN-HEMT), will be described as an example.

Figure 1:
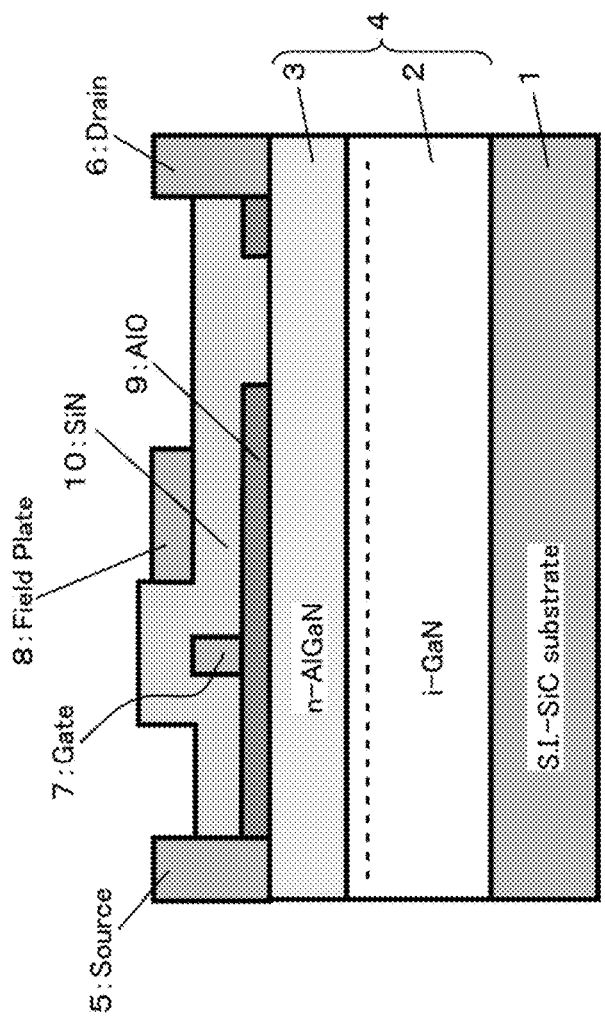
FIG. 1 is a schematic cross-sectional view illustrating the structure of a compound semiconductor device according to a first embodiment.

As depicted in FIG. 1, this MIS-type GaN-HEMT includes a GaN-based semiconductor stacked structure 4 including an i-GaN electron transit layer 2 and an n-AlGaN electron supply layer 3, on the semi-insulating SiC substrate 1. More specifically, this MIS-type GaN-HEMT includes the GaN-based semiconductor stacked structure 4 having the AlGaN electron supply layer 3 as the uppermost layer. In FIG. 1, two dimensional electron gas (2DEG) is depicted in the dotted line.

Note that the semi-insulating SiC substrate 1 is also referred to as a semi-insulating (SI)-SiC substrate or a semiconductor substrate. The GaN-based semiconductor stacked structure 4 is also referred to as a nitride semiconductor stacked structure or a compound semiconductor stacked structure. The i-GaN electron transit layer 2 is also referred to as a carrier transit layer. The n-AlGaN electron supply layer 3 is also referred to as a carrier supply layer.

Furthermore, this MIS-type GaN-HEMT includes a source electrode 5 and a drain electrode 6 provided, distant apart from each other, on the GaN-based semiconductor stacked structure 4.

This MIS-type GaN-HEMT also includes a gate electrode 7 provided on the GaN-based semiconductor stacked structure 4, between the source and drain electrodes 5 and 6.

This MIS-type GaN-HEMT also includes a field plate 8 provided between the gate and drain electrodes 7 and 6. In this embodiment, the field plate 8 is provided in parallel to the gate and drain electrodes 7 and 6, along the direction wherein the electrodes 7 and 6 extend. Note that the entire field plate 8 may not be located between the gate and drain electrodes 7 and 6, and at least a portion of the field plate 8 may be located between the gate and drain electrodes 7 and 6. For example, the field plate 8 may extend to above the gate electrode 7. Furthermore, the field plate 8 may have a canopy shape continuous with the gate electrode 7, for example. Even further, the field plate 8 may be connected to the source electrode 5 or may be connected to the gate electrode 7. Note that the field plate 8 is also referred to as a field plate electrode.

This MIS-type GaN-HEMT further includes a plurality of insulation films 9 and 10 on the GaN-based semiconductor stacked structure 4. In this embodiment, the MIS-type GaN-HEMT includes, as a plurality of insulation films, a gate insulation film 9 provided between the GaN-based semiconductor stacked structure 4 and the gate electrode 7 and a protection insulation film 10 covering the surface. More specifically, the surface of the GaN-based semiconductor stacked structure 4 is covered with a structure wherein the two insulation films 9 and 10 are stacked (i.e., insulation film stacked structure).

In this embodiment, the gate insulation film 9 covers the surface of the GaN-based semiconductor stacked structure 4, and extends from right below the gate electrode 7 to the source electrode 5 and to the drain electrode 6. In this embodiment, the gate insulation film 9 is an AlO film (aluminum oxide film), for example. Thus, the gate electrode 7 is provided on the GaN-based semiconductor stacked structure 4, having the gate insulation film 9 interposed therebetween.

The protection insulation film 10 covers the surfaces of the gate electrode 7 and the gate insulation film 9, and extends from above the gate electrode 7 to the source electrode 5 and to the drain electrode 6. In this embodiment, the protection insulation film 10 is an SiN film (silicon nitride film), for example. On the protection insulation film 10, the field plate 8 is provided. More specifically, the field plate 8 is provided over the GaN-based semiconductor stacked structure 4, having the gate insulation film 9 and the protection insulation film 10 interposed therebetween. Note that the protection insulation film 10 is also referred to as a passivation film.

Particularly, in this MIS-type GaN-HEMT, the distance between the gate electrode 7 or the field plate 8 and the drain electrode 6 is increased in order to further improve the withstanding voltage.

A longer distance, in turn, tends to deteriorate current collapse, resulting in a higher on-resistance. This is due to the gate insulation film 9 and the protection insulation film 10 extending between the field plate 8 and the drain electrode 6, which causes electrons to be trapped at the interface (junction interface) between the different insulation films during a higher voltage operation.

For preventing this phenomenon, in this MIS-type GaN-HEMT, the number of interfaces of the plurality of insulation films 9 and 10 is made smaller between the field plate 8 and the drain electrode 6 than in the vicinity of the gate electrode 7. Note that the "the number of interfaces of the plurality of insulation films is made smaller" encompasses the situation wherein no interface of the plurality of insulation films is present. This configuration can suppress trap of the electrons at the interface of the plurality of insulation films 9 and 10 during a higher voltage operation. In other words, the trap density at the interface of the plurality of insulation films 9 and 10 during a higher voltage operation can be reduced.

In this embodiment, no gate insulation film 9 is provided on the GaN-based semiconductor stacked structure 4 in a portion of the region between the field plate 8 and the drain electrode 6, such that the protection insulation film 10 contacts the GaN-based semiconductor stacked structure 4. More specifically, an insulation film stacked structure constructed from the gate insulation film 9 and the protection insulation film 10 is provided on the GaN-based semiconductor stacked structure 4 in the vicinity of the gate electrode 7. In contrast, only the protection insulation film 10 is provided on the GaN-based semiconductor stacked structure 4 in the portion of the region between the field plate 8 and the drain electrode 6. Accordingly, an interface of the insulation films is present in the vicinity of the gate electrode 7, while no interface of the insulation films is present in the portion of the region between the field plate 8 and the drain electrode 6. As set forth above, the number of interfaces of the plurality of insulation films 9 and 10 is made smaller between the field plate 8 and the drain electrode 6 than in the vicinity of the gate electrode 7. In this configuration, the protection insulation film 10 contacts the GaN-based semiconductor stacked structure 4 between the field plate 8 and the drain electrode 6, whereas protection insulation film 10 contacts the gate insulation film 9 in the vicinity of the gate electrode 7.

Hereinafter, a method of manufacturing the MIS-type GaN-HEMT according to the present embodiment will be explained with reference to FIGS. 2A to 2D.

Figure 2A:
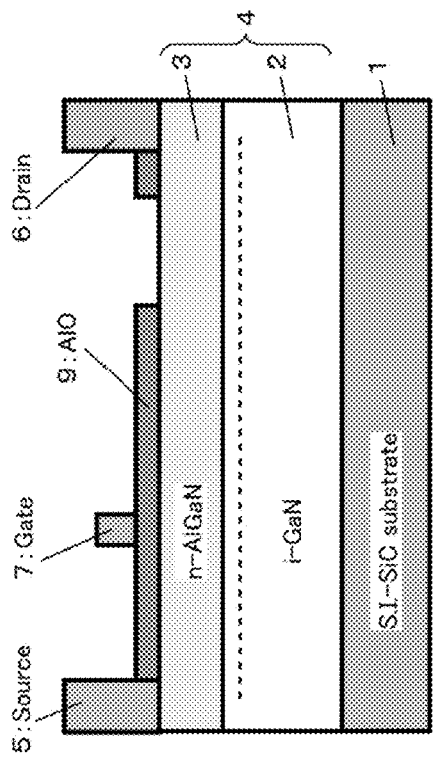
FIGS. 2A to 2D are schematic cross-sectional views illustrating a method of manufacturing the compound semiconductor device according to the first embodiment.

Initially, as depicted in FIG. 2A, over a semi-insulating conductive SiC substrate 1, an i-GaN electron transit layer 2, an i-AlGaN spacer layer (not illustrated), and an n-AlGaN electron supply layer 3 are deposited, in sequence, with a metal organic vapor phase epitaxy (MOVPE) technique, for example, to form a GaN-based semiconductor stacked structure 4.

In this embodiment, the i-GaN electron transit layer 2 has a thickness of about 3 μm. The i-AlGaN spacer layer has a thickness of about 5 nm. The n-AlGaN electron supply layer 3 has a thickness of about 30 nm, and an Si dope concentration of about $5 \times 10^{18}$ cm$^{-3}$, for example. Note that the i-AlGaN spacer layer is optional, and may be provided where necessary.

Next, an AlO film (gate insulation film) 9 is formed on the entire surface of the GaN-based semiconductor stacked structure 4, i.e., on the entire surface of the n-AlGaN electron supply layer 3, with an atomic layer deposition (ALD) technique, for example.

Subsequently, a resist mask (not illustrated) having respective openings in regions where source and drain electrodes are to be formed (hereinafter, the source and drain electrode formation regions), is formed using photolithography, for example. The AlO film 9 in the source and drain electrode formation regions is removed using this resist mask, with wet or dry etching, or the like, for example.

Subsequently, source and drain electrodes 5 and 6 made of Ta/Al, for example, are formed on the n-AlGaN electron supply layer 3 in the respective source and drain electrode formation regions, using photolithography and evaporation and lift-off techniques, for example. An annealing process is then performed to establish ohmic characteristics of the source and drain electrodes 5 and 6.

Next, a gate electrode 7 made of Ni/Au, for example, is formed on the AlO film 9 in the gate electrode formation region, using photolithography and evaporation and lift-off techniques, for example. In this embodiment, in order to improve the withstanding voltage, the gate electrode 7 is formed such that the gate and drain electrodes 7 and 6 are located distant apart.

Figure 2B:
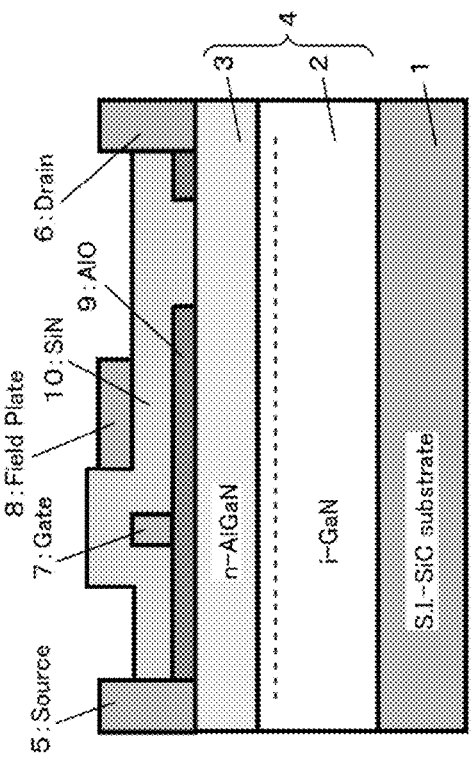

Subsequently, a resist mask (not illustrated) having an opening in a region (a partial region, in this example) between the field plate formation region and the drain electrode 6 is formed with photolithography, for example. As depicted in FIG. 2B, the AlO film 9 in the region between the field plate formation region and the drain electrode 6 is then removed using this resist mask, for example, with wet or dry etching, or the like.

Figure 2C:
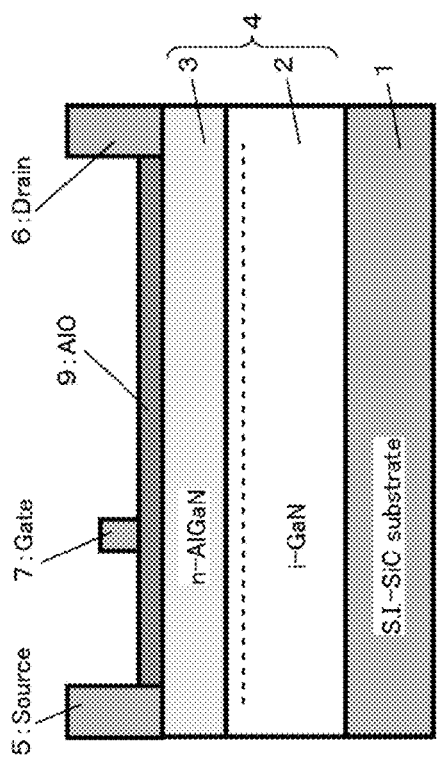

Subsequently, as depicted in FIG. 2C, silicon nitride (SiN) is deposited on the entire surface with a plasma chemical vapor deposition (CVD) technique, for example, to form an SiN film (protection insulation film) 10. More specifically, the SiN film 10 is formed so as to cover the surfaces of the gate electrode 7, the AlO film 9, and the GaN-based semiconductor stacked structure 4 (i.e., the n-AlGaN electron supply layer 3). This step covers the surface of the GaN-based semiconductor stacked structure 4 with an insulation film stacked structure wherein the two insulation films 9 and 10 are stacked.

Figure 2D:
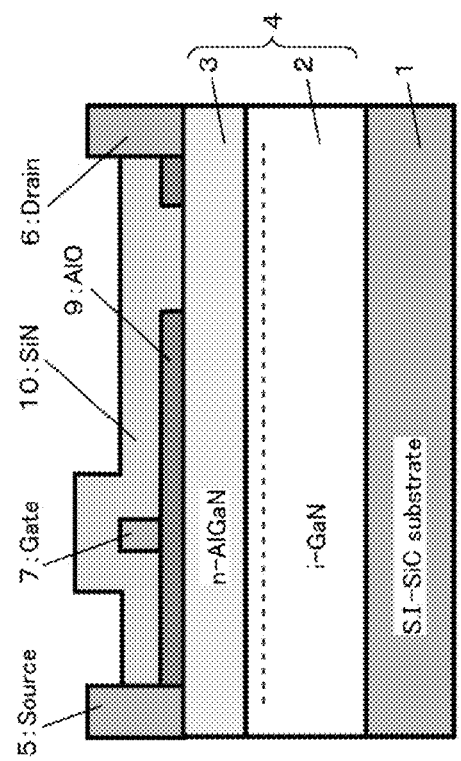

Subsequently, as depicted in FIG. 2D, a field plate 8 is formed on the SiN film 10 between the gate and drain electrodes 7 and 6, using photolithography and evaporation and lift-off techniques, for example. This step forms the field plate 8 over the GaN-based semiconductor stacked structure 4, having the gate insulation film 9 and the protection insulation film 10 interposed therebetween.

Particularly, the AlO film 9 as a gate insulation film is not provided on the GaN-based semiconductor stacked structure 4 in a portion of the region between the field plate 8 and the drain electrode 6, such that the SiN film 10 as a protection insulation film contacts the GaN-based semiconductor stacked structure 4. More specifically, an insulation film stacked structure constructed from the AlO film 9 and the SiN film 10 is provided on the GaN-based semiconductor stacked structure 4 in the vicinity of the gate electrode 7. In contrast, only the SiN film 10 is provided on the GaN-based semiconductor stacked structure 4 in the portion of the region between the field plate 8 and the drain electrode 6. Accordingly, an interface of the insulation films is present in the vicinity of the gate electrode 7, while no interface of the insulation films is present in the portion of the region between the field plate 8 and the drain electrode 6. As set forth above, the number of interfaces of the plurality of insulation films 9 and 10 is made smaller between the field plate 8 and the drain electrode 6 than in the vicinity of the gate electrode 7. This configuration can suppress trap of the electrons at the interface of the plurality of insulation films 9 and 10 during a higher voltage operation. In this configuration, the protection insulation film 10 contacts the GaN-based semiconductor stacked structure 4 between the field plate 8 and the drain electrode 6, whereas protection insulation film 10 contacts the gate insulation film 9 in the vicinity of the gate electrode 7.

An MIS-type GaN-HEMT may be fabricated in the steps set forth above.

Accordingly, since trap of electrons at the interface of the plurality of insulation films 9 and 10 during a higher voltage operation is suppressed, the compound semiconductor device according to the present embodiment can suppress an increase in current collapse, which results in an increased on-resistance. More specifically, the compound semiconductor device according to the present embodiment provides an advantage in that the withstanding voltage is improved while suppressing any increase in the on-resistance, thereby achieving a compound semiconductor device with the two contradictory characteristics of a higher withstanding voltage and lower on-resistance. A compound semiconductor device having such characteristics is preferably used for devices, such as power switching devices.

While the gate insulation film 9 is an AlO film and the protection insulation film 10 is an SiN film in the above-described embodiment, the materials for the insulation films are not limited to these particular materials. For example, an oxide, nitride or oxinitride of Ta, Ti, Si, Al, Hf, or Zr, may be used for these insulation films.

Furthermore, while the plurality of insulation films provided on the GaN-based semiconductor stacked structure 4 are made from different elements, i.e., the gate insulation film 9 is an AlO film and the protection insulation film 10 is an SiN film in the above-described embodiment, this is not limiting and they may be made from the same element. More specifically, even when the plurality of insulation films are made from the same element, an interface (s) between the plurality of insulation films is defined when they are formed in separate steps, in the similar manner when the insulation films are made from different elements. Accordingly, even when the plurality of insulation films are made from the same element, an interface(s) may be defined between the plurality of insulation films and the present embodiment can be applied to such a case.

Furthermore, while the protection insulation film 10 contacts the GaN-based semiconductor stacked structure 4 in a portion of the region between the field plate 8 and the drain electrode 6 in the above-described embodiment, this is not limiting. The protection insulation film 10 may contact the GaN-based semiconductor stacked structure 4 in at least a portion of the region between the field plate 8 and the drain electrode 6.

Figure 3A:
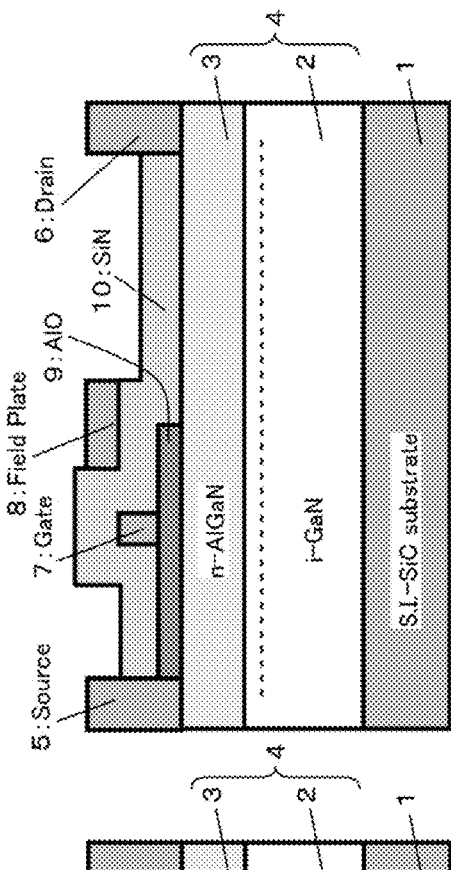
FIGS. 3A to 3C are schematic cross-sectional views illustrating the structure of the compound semiconductor device according to variants of the first embodiment.

For example, as depicted in FIG. 3A, the protection insulation film 10 may contact the GaN-based semiconductor stacked structure 4 in the entire region between the field plate 8 and the drain electrode 6. In other words, no gate insulation film 9 may be provided in the entire region between the field plate 8 and the drain electrode 6, such that the surface of the GaN-based semiconductor stacked structure 4 is covered only with the protection insulation film 10. In such a case, the gate insulation film 9 extends from right below the gate electrode 7 to below the field plate 8.

Figure 3B:
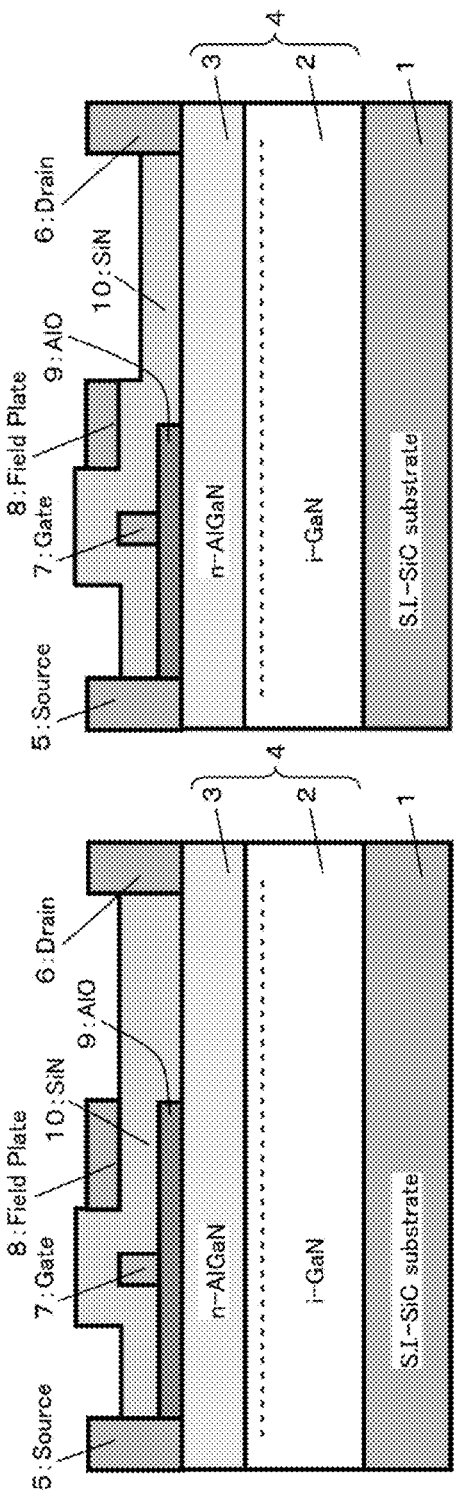
Figure 3C:
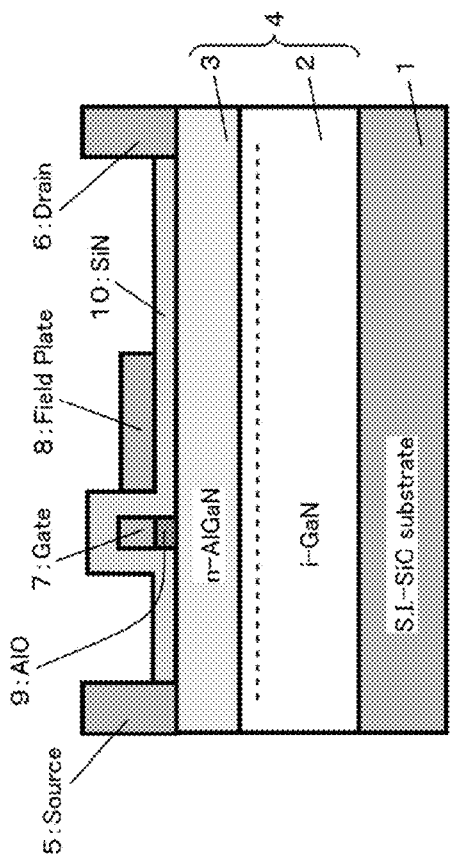

Furthermore, for example, as depicted in FIGS. 3B and 3C, the region wherein the protection insulation film 10 contacts the GaN-based semiconductor stacked structure 4, i.e., the region wherein no gate insulation film 9 is provided, may extend from a region between the field plate 8 and the drain electrode 6 to a region below the field plate 8. In such a case, the gate insulation film 9 may be provided so as to extend from right below the gate electrode 7 to a middle position below the field plate and to the source electrode 5, as depicted in FIG. 3B, or may be provided only right below the bottom of the gate electrode 7, as depicted in FIG. 3C. Also in these configurations, the protection insulation film 10 contacts the GaN-based semiconductor stacked structure 4 between the field plate 8 and the drain electrode 6, whereas protection insulation film 10 contacts the gate insulation film 9 in the vicinity of the gate electrode 7. Particularly, the field plate 8 approaches the surface of the GaN-based semiconductor stacked structure 4 when only a single insulation film 10 is provided between the field plate 8 and the GaN-based semiconductor stacked structure 4, as depicted in FIG. 3C. The advantageous effect of alleviating the electric field intensity applied on the end of the gate electrode 7 is improved, which further improves the withstanding voltage.

Furthermore, a plurality of protection insulation films may be provided as a protection insulation film covering a surface, in order to further improve the withstanding voltage. For example, as depicted in FIG. 4D, two insulation films, i.e., an AlO film 11 covering the top and side faces of the gate electrode 7, and an SiN film 10 covering the surfaces of the AlO film 11 and the GaN-based semiconductor stacked structure 4, may be provided as the plurality of protection insulation films. In such a case, the AlO film 9 as a gate insulation film may be provided only right below the gate electrode 7 and in the vicinity (periphery) of the gate electrode 7.

An MIS-type GaN-HEMT constructed as described above may be manufactured as follows.

Initially, in the manner similar to the above-described embodiment, as depicted in FIG. 4A, after forming a GaN-based semiconductor stacked structure 4 including an i-GaN electron transit layer 2 and an n-AlGaN electron supply layer 3 over a semi-insulating conductive SiC substrate 1, an AlO film (gate insulation film) 9 is formed on the entire surface. Subsequently, in the manner similar to the above-described first embodiment, a source electrode 5, a drain electrode 6, and a gate electrode 7 are formed, as depicted in FIG. 4B.

Next, an AlO film (protection insulation film) 11 is formed on the entire surface using an ALD technique, for example. More specifically, the AlO film 11 is formed so as to cover the surfaces of the AlO film 9 functioning as gate insulation films between the gate electrode 7 and the GaN-based semiconductor stacked structure 4, and the gate electrode 7.

Subsequently, a resist mask (not illustrated) having an opening in the entire region other than the vicinity of the gate electrode 7 is formed using photolithography, for example. As depicted in FIG. 4C, the AlO films 9 and 11 in the entire region other than the vicinity of the gate electrode 7 are then removed using this resist mask, for example, with wet or dry etching, or the like.

Subsequently, in the manner similar to the above-described embodiment, as depicted in FIG. 4D, an SiN film (protection insulation film) 10 is formed on the entire surface. More specifically, the SiN film 10 is formed so as to cover the surfaces of the AlO film 11 covering the surface of the gate electrode 7, and the GaN-based semiconductor stacked structure 4 (i.e., the n-AlGaN electron supply layer 3). In this step, the two protection insulation films 10 and 11 are formed as a protection insulation film covering the surface.

Subsequently, in the manner similar to the above-described embodiment, a field plate 8 is formed on the SiN film 10 between the gate and drain electrodes 7 and 6. This step forms the field plate 8 over the GaN-based semiconductor stacked structure 4, having the SiN film 10 interposed therebetween.

In this case, the AlO film 9 as a gate insulation film is not provided on the GaN-based semiconductor stacked structure 4 in the region between the field plate 8 and the drain electrode 6 (the entire region, in this example), such that the SiN film 10, as the upper protection insulation films of the two protection insulation films, contacts the GaN-based semiconductor stacked structure 4. In contrast, the AlO film 11, as the lower protection insulation film of two protection insulation films, and the SiN film 10, as the upper protection insulation film, contact the AlO film 9 as a gate insulation film, in the vicinity of the gate electrode 7. More specifically, an insulation film stacked structure is provided on the GaN-based semiconductor stacked structure 4 in the vicinity of the gate electrode 7. In contrast, only the protection insulation film 10 is provided on the GaN-based semiconductor stacked structure 4 in the region between the field plate 8 and the drain electrode 6. Accordingly, an interface of the insulation films is present in the vicinity of the gate electrode 7, while no interface of the insulation films is present in the region between the field plate 8 and the drain electrode 6. As set forth above, the number of interfaces of the plurality of insulation films 9, 10, and 11 is made smaller between the field plate 8 and the drain electrode 6 than in the vicinity of the gate electrode 7. This configuration can suppress trap of the electrons at the interface of the plurality of insulation films 9, 10, and 11 during a higher voltage operation. In this configuration, the upper protection insulation film 10 in the two protection insulation films contacts the GaN-based semiconductor stacked structure 4 between the field plate 8 and the drain electrode 6, whereas upper protection insulation film 10 contacts the gate insulation film 9 in the vicinity of the gate electrode 7.

The MIS-type GaN-HEMT constructed as described above may be fabricated in the steps set forth above.

Second Embodiment

A compound semiconductor device according to a second embodiment will be described with reference to FIGS. 5A to 5D.

The compound semiconductor device according to the present embodiment is different from that in the above-described first embodiment (see FIG. 1) in that a plurality of protection insulation films are provided as a protection insulation film covering the surface.

More specifically, as depicted in FIG. 5D, this MIS-type GaN-HEMT includes the plurality of protection insulation films 10-12 as a protection insulation film.

In this embodiment, as the plurality of protection insulation films, three insulation films, i.e., an AlO film 11, a diamond like carbon (DLC) film 12, and an SiN film 10, are provided. More specifically, the AlO film 11, the DLC film 12, and the SiN film 10 as a protection insulation film are stacked on the AlO film 9 as a gate insulation film. This configuration can improve the withstanding voltage. Particularly, since the protection insulation films include the DLC film 12, the withstanding voltage (insulation withstanding voltage) can be further improved. For this purpose, the surface of the GaN-based semiconductor stacked structure 4 is covered with a structure wherein four insulation films 9-12 are stacked (i.e., insulation film stacked structure). Note that the DLC film 12 is also referred to as an amorphous carbon film or an amorphous film containing carbon as the main component. In FIGS. 5A to 5D, the same elements as those in the above-described first embodiment (see FIG. 1) are referenced by the like reference symbols.

In this embodiment, the lower AlO film 11 of the three protection insulation films covers the top and side faces of the gate electrode 7, and the surface of the AlO film 9 as a gate insulation film. The intermediate DLC film 12 of the three protection insulation films covers the surface of the lower AlO film 11. The upper SiN film 10 of the three protection insulation films covers the surfaces of the intermediate DLC film 12 and the GaN-based semiconductor stacked structure 4.

Furthermore, in this MIS-type GaN-HEMT, a field plate 8 is provided on the upper SiN film 10 of the three protection insulation films. More specifically, the field plate 8 is provided over the GaN-based semiconductor stacked structure 4, having the gate insulation film 9 and the three protection insulation films 10-12 interposed therebetween.

Furthermore, in this MIS-type GaN-HEMT, the AlO film 9 as a gate insulation film, and the intermediate DLC film 12 and the lower AlO film 11 of the three protection insulation films are not provided over the GaN-based semiconductor stacked structure 4, in a portion of the region between the field plate 8 and the drain electrode 6, such that the upper SiN film 10 of the three protection insulation films contacts the GaN-based semiconductor stacked structure 4. More specifically, an insulation film stacked structure constructed from the gate insulation film 9 and three protection insulation films 10-12 is provided on the GaN-based semiconductor stacked structure 4 in the vicinity of the gate electrode 7. In contrast, only the upper SiN film 10 of the three protection insulation films is provided on the GaN-based semiconductor stacked structure 4 in the portion of the region between the field plate 8 and the drain electrode 6. Accordingly, an interface of the insulation films is present in the vicinity of the gate electrode 7, while no interface of the insulation films is present in the portion of the region between the field plate 8 and the drain electrode 6. As set forth above, the number of interfaces of the plurality of insulation films 9-12 is made smaller between the field plate 8 and the drain electrode 6 than in the vicinity of the gate electrode 7. Note that the "the number of interfaces of the plurality of insulation films is made smaller" encompasses the situation wherein no interface of a plurality of insulation films is present. This configuration can suppress trap of the electrons at the interface of the plurality of insulation films 9-12 during a higher voltage operation. In other words, the trap density at the interface of the plurality of insulation films 9-12 during a higher voltage operation can be reduced. In such a case, the uppermost SiN film 10 of the plurality of insulation films contacts the GaN-based semiconductor stacked structure 4 between the field plate 8 and the drain electrode 6, while the lowermost AlO film 11 of the plurality of insulation films contacts the gate insulation film 9 in the vicinity of the gate electrode 7.

Next, a method of manufacturing the MIS-type GaN-HEMT according to the present embodiment will be described.

Initially, in the manner similar to the above-described first embodiment, as depicted in FIG. 5A, after forming a GaN-based semiconductor stacked structure 4 including an i-GaN electron transit layer 2 and an n-AlGaN electron supply layer 3 over a semi-insulating SiC substrate 1, an AlO film (gate insulation film) 9 is formed on the entire surface. Subsequently, in the manner similar to the above-described first embodiment, a source electrode 5, a drain electrode 6, and a gate electrode 7 are formed.

Next, as depicted in FIG. 5B, an AlO film (protection insulation film) 11 is formed on the entire surface using an ALD technique, for example. More specifically, the AlO film 11 is formed so as to cover the surfaces of the AlO film 9 functioning as gate insulation films between the gate electrode 7 and the GaN-based semiconductor stacked structure 4, and the gate electrode 7.

Next, a DLC film (protection insulation film) 12 is formed on the entire surface using a filtered cathodic arc (FCA) technique, for example. More specifically, the DLC film 12 is formed so as to cover the surface of the AlO film 11 as a protection insulation film.

Subsequently, a resist mask (not illustrated) having an opening in a region (a partial region, in this example) between the field plate formation region and the drain electrode 6 is formed with photolithography, for example. As depicted in FIG. 5C, the DLC film 12 and the AlO films 11 and 9 in the region between the field plate formation region and the drain electrode 6 is then removed using this resist mask, for example, with wet or dry etching, or ion milling, or the like.

Subsequently, in the manner similar to the above-described first embodiment, as depicted in FIG. 5D, an SiN film (protection insulation film) 10 is formed on the entire surface, with a plasma CVD technique, for example. More specifically, the SiN film 10 is formed so as to cover the surfaces of the DLC film and the GaN-based semiconductor stacked structure 4 (i.e., the n-AlGaN electron supply layer 3). This step covers the surface of the GaN-based semiconductor stacked structure 4 with an insulation film stacked structure wherein the four insulation films 9-12 are stacked.

Subsequently, in the manner similar to the above-described first embodiment, a field plate 8 is formed on the SiN film 10 between the gate and drain electrodes 7 and 6, using photolithography and evaporation and lift-off techniques, for example. This step forms the field plate 8 over the GaN-based semiconductor stacked structure 4, having the gate insulation film 9 and the three protection insulation films 10-12 interposed therebetween.

An MIS-type GaN-HEMT may be fabricated in the steps set forth above.

The other details are similar to those in the above-described first embodiment, and descriptions thereof will be omitted.

Accordingly, since trap of electrons at the interface of the plurality of insulation films 9-12 during a higher voltage operation is suppressed, the compound semiconductor device according to the present embodiment can suppress an increase in current collapse, which results in an increased on-resistance. More specifically, the compound semiconductor device according to the present embodiment provides an advantage in that the withstanding voltage is improved while suppressing any increase in the on-resistance, thereby achieving a compound semiconductor device with the two contradictory characteristics of a higher withstanding voltage and lower on-resistance.

Note that the variants of the above-described first embodiment may be applied to this embodiment described above.

While the gate insulation film 9 is an AlO film, the lower protection insulation film 11 is an AlO film, and the upper protection insulation film 10 is an SiN film in the above-described embodiment, the materials for the insulation films are not limited to these particular materials. For example, an oxide, nitride or oxinitride of Ta, Ti, Si, Al, Hf, or Zr, may be used for these insulation films.

Furthermore, while the insulation films are made from different elements, i.e., the gate insulation film 9 is an AlO film, the lower protection insulation film 11 is an AlO film, and the upper protection insulation film 10 is an SiN film, in the above-described embodiment, this is not limiting and they may be made from the same element.

Furthermore, while the protection insulation film 10 contacts the GaN-based semiconductor stacked structure 4 in a portion of the region between the field plate 8 and the drain electrode 6 in the above-described embodiment, this is not limiting. The protection insulation film 10 may contact the GaN-based semiconductor stacked structure 4 in at least a portion of the region between the field plate 8 and the drain electrode 6. More specifically, the protection insulation film 10 may contact the GaN-based semiconductor stacked structure 4 in the entire region between the field plate 8 and the drain electrode 6, for example. Furthermore, for example, the region wherein the protection insulation film 10 contacts the GaN-based semiconductor stacked structure 4, i.e., the region wherein no gate insulation film 9 is provided, may extend from a region between the field plate 8 and the drain electrode 6 to a region below the field plate 8. Furthermore, for example, the lowermost protection insulation film, or the lowermost and intermediate protection insulation films, of the plurality of protection insulation films may be provided so as to cover only the top and side faces of the gate electrode 7, while a gate insulation film may be provided only right below the gate electrode 7 and in the vicinity of the gate electrode 7.

Third Embodiment

A compound semiconductor device according to a third embodiment will be described with reference to FIGS. 6A to 6D.

The compound semiconductor device according to the present embodiment is different from that in the above-described second embodiment (see FIGS. 5A to 5D) in that an uppermost protection insulation film 10 of a plurality of protection insulation films contacts a gate insulation film 9 between a field plate 8 and a drain electrode 6, as depicted in FIG. 6D. The same elements in FIGS. 6A to 6D as in the above-described second embodiment (see FIGS. 5A to 5D) are referenced by the like reference symbols.

Furthermore, in this MIS-type GaN-HEMT, an intermediate DLC film 12 and a lower AlO film 11 of the three protection insulation films are not provided above a GaN-based semiconductor stacked structure 4, in a portion of the region between the field plate 8 and the drain electrode 6, such that the upper SiN film 10 of the three protection insulation films contacts the surface of the AlO film 9 as a gate insulation film. More specifically, an insulation film stacked structure constructed from the gate insulation film 9 and three protection insulation films 10-12 is provided on the GaN-based semiconductor stacked structure 4 in the vicinity of the gate electrode 7. In contrast, only the AlO film 9 as a gate insulation film and the upper SiN film 10 of the three protection insulation films are provided over the GaN-based semiconductor stacked structure 4 in the portion of the region between the field plate 8 and the drain electrode 6. As a result, the number of interfaces of the plurality of insulation films 9-12 is made smaller between the field plate 8 and the drain electrode 6 than in the vicinity of the gate electrode 7. This configuration can suppress trap of the electrons at the interface of the plurality of insulation films 9-12 during a higher voltage operation. In such a case, the uppermost SiN film 10 of the plurality of insulation films contacts the gate insulation film 9 between the field plate 8 and the drain electrode 6, while the lowermost AlO film 11 of the plurality of insulation films contacts the gate insulation film 9 in the vicinity of the gate electrode 7.

Next, a method of manufacturing the MIS-type GaN-HEMT according to the present embodiment will be described.

Initially, in the manner similar to the above-described second embodiment, as depicted in FIG. 6A, after forming a GaN-based semiconductor stacked structure 4 including an i-GaN electron transit layer 2 and an n-AlGaN electron supply layer 3 over a semi-insulating SiC substrate 1, an AlO film (gate insulation film) 9 is formed on the entire surface. Subsequently, in the manner similar to the above-described second embodiment, a source electrode 5, a drain electrode 6, and a gate electrode 7 are formed.

Next, in the manner similar to the above-described second embodiment, as depicted in FIG. 6B, an AlO film (protection insulation film) 11 and a DLC film (protection insulation film) 12 are formed.

Subsequently, a resist mask (not illustrated) having an opening in a region (a partial region, in this example) between the field plate formation region and the drain electrode 6 is formed with photolithography, for example. As depicted in FIG. 6C, the DLC film 12 and the AlO film 11 in the region between the field plate formation region and the drain electrode 6 is then removed using this resist mask, for example, with wet or dry etching, or ion milling, or the like.

In this step, since the AlO film 9 as a gate insulation film covering the surface of the GaN-based semiconductor stacked structure 4 is remained in this embodiment, the GaN-based semiconductor stacked structure 4 is protected from any damage. While the entire AlO film 9 as a gate insulation film is remained in the thickness direction in this example, this is not limiting. For example, a portion of the AlO film 9 may be removed in the thickness direction.

Subsequently, in the manner similar to the above-described second embodiment, as depicted in FIG. 6D, an SiN film (protection insulation film) 10 is formed. More specifically, the SiN film 10 is formed so as to cover the DLC film 12 and the surface of the AlO film 9 as a gate insulation film. This step covers the surface of the GaN-based semiconductor stacked structure 4 with an insulation film stacked structure wherein the four insulation films 9-12 are stacked.

Subsequently, in the manner similar to the above-described second embodiment, a field plate 8 is formed on the SiN film 10 between the gate and drain electrodes 7 and 6. This step forms the field plate 8 over the GaN-based semiconductor stacked structure 4, having the gate insulation film 9 and the three protection insulation films 10-12 interposed therebetween.

An MIS-type GaN-HEMT may be fabricated in the steps set forth above.

The other details are similar to those in the above-described second embodiment, and descriptions thereof will be omitted.

Accordingly, since trap of electrons at the interface of the plurality of insulation films 9-12 during a higher voltage operation is suppressed, the compound semiconductor device according to the present embodiment can suppress an increase in current collapse, which results in an increased on-resistance. More specifically, the compound semiconductor device according to the present embodiment provides an advantage in that the withstanding voltage is improved while suppressing any increase in the on-resistance, thereby achieving a compound semiconductor device with the two contradictory characteristics of a higher withstanding voltage and lower on-resistance.

Note that the variants of the above-described first embodiment may be applied to this embodiment described above, similarly to the above-described second embodiment.

Fourth Embodiment

A compound semiconductor device according to a fourth embodiment will be described with reference to FIGS. 7A to 7D.

The compound semiconductor device according to the present embodiment is different from that in the above-described first embodiment (see FIG. 1) in that a field plate 8 is provided on an AlO film 9 functioning as a gate insulation film between a gate electrode 7 and a nitride semiconductor stacked structure 4, as depicted in FIG. 7D. In FIGS. 7A to 7D, the same elements as those in the above-described first embodiment (see FIG. 1) are referenced by the like reference symbols.

More specifically, in this MIS-type GaN-HEMT, the gate electrode 7 and the field plate 8 are provided on the AlO film 9 as a gate insulation film. The surfaces of the gate electrode 7, the field plate 8, the gate insulation film 9, and the GaN-based semiconductor stacked structure 4 are covered with an SiN film 10 as a protection insulation film. Thus, the field plate 8 is provided over the GaN-based semiconductor stacked structure 4, having the gate insulation film 9 interposed therebetween. In this configuration, since only a single insulation film 9 is provided between the field plate 8 and the GaN-based semiconductor stacked structure 4, the field plate 8 approaches the surface of the GaN-based semiconductor stacked structure 4. The advantageous effect of alleviating the electric field intensity applied on the end of the gate electrode 7 is improved, which further improves the withstanding voltage.

Next, a method of manufacturing the MIS-type GaN-HEMT according to the present embodiment will be described.

Initially, in the manner similar to the above-described first embodiment, as depicted in FIG. 7A, after forming a GaN-based semiconductor stacked structure 4 including an i-GaN electron transit layer 2 and an n-AlGaN electron supply layer 3 over a semi-insulating SiC substrate 1, an AlO film (gate insulation film) 9 is formed on the entire surface. Subsequently, in the manner similar to the above-described first embodiment, a source electrode 5 and a drain electrode 6 are formed.

Next, a gate electrode 7 made of Ni/Au, for example, is formed on the AlO film 9 in the gate electrode formation region, using photolithography and evaporation and lift-off techniques, for example. Subsequently, as depicted in FIG. 7B, a field plate 8 is formed on the AlO film 9 between the gate and drain electrodes 7 and 6, using photolithography and evaporation and lift-off techniques, for example. This step forms the gate electrode 7 and the field plate 8 over the GaN-based semiconductor stacked structure 4, having the gate insulation film 9 interposed therebetween. Note that the step count can be reduced by forming the gate electrode 7 and the field plate 8 simultaneously, which simplifies the manufacturing processes. In such a case, the gate electrode 7 and the field plate 8 are made from the same material and have the identical structure.

Subsequently, in the manner similar to the above-described first embodiment, a resist mask (not illustrated) having an opening in a region (a partial region, in this example) between the field plate 8 and the drain electrode 6 is formed with photolithography, for example. As depicted in FIG. 7C, the AlO film 9 between the field plate 8 and the drain electrode 6 is then removed using this resist mask, for example, with wet or dry etching, or the like.

Subsequently, in the manner similar to the above-described first embodiment, as depicted in FIG. 7D, an SiN film (protection insulation film) 10 is formed on the entire surface. More specifically, the SiN film 10 is formed so as to cover the surfaces of the field plate 8, the gate electrode 7, the AlO film 9, and the GaN-based semiconductor stacked structure 4 (i.e., the n-AlGaN electron supply layer 3).

An MIS-type GaN-HEMT may be fabricated in the steps set forth above.

In this case, the AlO film 9 as a gate insulation film is not provided on the GaN-based semiconductor stacked structure 4 in a portion of the region between the field plate 8 and the drain electrode 6, such that the SiN film 10 as a protection insulation film contacts the GaN-based semiconductor stacked structure 4. More specifically, an insulation film stacked structure constructed from the AlO film 9 and the SiN film 10 is provided on the GaN-based semiconductor stacked structure 4 in the vicinity of the gate electrode 7. In contrast, only the SiN film 10 is provided on the GaN-based semiconductor stacked structure 4 in the portion of the region between the field plate 8 and the drain electrode 6. Accordingly, an interface of the insulation films is present in the vicinity of the gate electrode 7, while no interface of the insulation films is present in the portion of the region between the field plate 8 and the drain electrode 6. As set forth above, the number of interfaces of the plurality of insulation films 9 and 10 is made smaller between the field plate 8 and the drain electrode 6 than in the vicinity of the gate electrode 7. This configuration can suppress trap of the electrons at the interface of the plurality of insulation films 9 and 10 during a higher voltage operation. In this configuration, the protection insulation film 10 contacts the GaN-based semiconductor stacked structure 4 between the field plate 8 and the drain electrode 6, whereas protection insulation film 10 contacts the gate insulation film 9 in the vicinity of the gate electrode 7.

The other details are similar to those in the above-described first embodiment, and descriptions thereof will be omitted.

Accordingly, since trap of electrons at the interface of the plurality of insulation films 9 and 10 during a higher voltage operation is suppressed, the compound semiconductor device according to the present embodiment can suppress an increase in current collapse, which results in an increased on-resistance. More specifically, the compound semiconductor device according to the present embodiment provides an advantage in that the withstanding voltage is improved while suppressing any increase in the on-resistance, thereby achieving a compound semiconductor device with the two contradictory characteristics of a higher withstanding voltage and lower on-resistance.

Note that the variants of the above-described first embodiment may be applied to this embodiment described above.

That is, although the gate insulation film 9 is an AlO film and the protection insulation film 10 is an SiN film in the above-described embodiment, the materials for the insulation films are not limited to these particular materials. For example, an oxide, nitride or oxinitride of Ta, Ti, Si, Al, Hf, or Zr, may be used for these insulation films.

Furthermore, while the plurality of insulation films provided on the GaN-based semiconductor stacked structure 4 are made from different elements, i.e., the gate insulation film 9 is an AlO film and the protection insulation film 10 is an SiN film in the above-described embodiment, this is not limiting and they may be made from the same element.

Furthermore, while the protection insulation film 10 contacts the GaN-based semiconductor stacked structure 4 in a portion of the region between the field plate 8 and the drain electrode 6 in the above-described embodiment, this is not limiting. The protection insulation film 10 may contact the GaN-based semiconductor stacked structure 4 in at least a portion of the region between the field plate 8 and the drain electrode 6. For example, the protection insulation film 10 may contact the GaN-based semiconductor stacked structure 4 in the entire region between the field plate 8 and the drain electrode 6. Furthermore, for example, a plurality of protection insulation films may be provided. In this case, at least one protection insulation film other than the uppermost protection insulation film of the plurality of protection insulation films may be provided so as to cover only the top and side faces of the gate electrode 7, while a gate insulation film may be provided only right below the gate electrode 7 and in the vicinity of the gate electrode 7.

Note that the above-described embodiment has been described above as a variant of the first embodiment described above, this is not limiting and it may be configured as a variant of the above-described second or third embodiment.

Fifth Embodiment

A compound semiconductor device according to a fifth embodiment will be described with reference to FIGS. 8A to 8D.

The compound semiconductor device according to the present embodiment is different from that in the above-described first embodiment (see FIG. 1) in that a gate recess 13 is provided, as depicted in FIG. 8D. In FIGS. 8A to 8D, the same elements as those in the above-described first embodiment (see FIG. 1) are referenced by the like reference symbols.

More specifically, in this MIS-type GaN-HEMT, a gate recess (recess structure) 13 is defined in a GaN-based semiconductor stacked structure 4 right below a gate electrode 7 (the n-AlGaN electron supply layer 3, in this embodiment). This structure helps to increase the threshold voltage.

Next, a method of manufacturing the MIS-type GaN-HEMT according to the present embodiment will be described.

Initially, in the manner similar to the above-described first embodiment, as depicted in FIG. 8A, a GaN-based semiconductor stacked structure 4 including an i-GaN electron transit layer 2 and an n-AlGaN electron supply layer 3 over a semi-insulating SiC substrate 1 is formed.

Subsequently, a resist mask (not illustrated) having an opening in a region where a gate recess is to be formed (hereinafter, the gate recess formation region), is formed using photolithography, for example. A portion of the n-AlGaN electron supply layer 3 in the gate recess formation region is removed using this resist mask, with dry etching using a chlorine-based gas, for example to form a gate recess 13.

Note that although the portion of the n-AlGaN electron supply layer 3 is removed in the thickness direction in this embodiment, this is not limiting and the entire n-AlGaN electron supply layer 3 may be removed in the thickness direction.

Next, in the manner similar to the above-described first embodiment, as depicted in FIG. 8B, after forming an AlO film (gate insulation film) 9 on the entire surface, a source electrode 5, a drain electrode 6, and a gate electrode 7 are formed.

Subsequently, in the manner similar to the above-described first embodiment, as depicted in FIG. 8C, the AlO film 9 in a region (a partial region, in this example) between the field plate formation region and the drain electrode 6 is removed.

Thereafter, in the manner similar to the above-described first embodiment, as depicted in FIG. 8D, after forming an SiN film (protection insulation film) 10 on the entire surface, a field plate 8 is formed on the SiN film 10 between the gate and drain electrodes 7 and 6.

An MIS-type GaN-HEMT may be fabricated in the steps set forth above.

The other details are similar to those in the above-described first embodiment, and descriptions thereof will be omitted.

Accordingly, since trap of electrons at the interface of the plurality of insulation films 9 and 10 during a higher voltage operation is suppressed, the compound semiconductor device according to the present embodiment can suppress an increase in current collapse, which results in an increased on-resistance. More specifically, the compound semiconductor device according to the present embodiment provides an advantage in that the withstanding voltage is improved while suppressing any increase in the on-resistance, thereby achieving a compound semiconductor device with the two contradictory characteristics of a higher withstanding voltage and lower on-resistance.

Note that the variants of the above-described first embodiment may be applied to this embodiment described above.

That is, although the gate insulation film 9 is an AlO film and the protection insulation film 10 is an SiN film in the above-described embodiment, the materials for the insulation films are not limited to these particular materials. For example, an oxide, nitride or oxinitride of Ta, Ti, Si, Al, Hf, or Zr, may be used for these insulation films.

Furthermore, while the plurality of insulation films provided on the GaN-based semiconductor stacked structure 4 are made from different elements, i.e., the gate insulation film 9 is an AlO film and the protection insulation film 10 is an SiN film in the above-described embodiment, this is not limiting and they may be made from the same element.

Furthermore, while the protection insulation film 10 contacts the GaN-based semiconductor stacked structure 4 in a portion of the region between the field plate 8 and the drain electrode 6 in the above-described embodiment, this is not limiting. The protection insulation film 10 may contact the GaN-based semiconductor stacked structure 4 in at least a portion of the region between the field plate 8 and the drain electrode 6. More specifically, the protection insulation film 10 may contact the GaN-based semiconductor stacked structure 4 in the entire region between the field plate 8 and the drain electrode 6, for example. Furthermore, for example, the region wherein the protection insulation film 10 contacts the GaN-based semiconductor stacked structure 4, i.e., the region wherein no gate insulation film 9 is provided, may extend from a region between the field plate 8 and the drain electrode 6 to a region below the field plate 8. Furthermore, for example, a plurality of protection insulation films may be provided. In this case, at least one protection insulation film other than the uppermost protection insulation film of the plurality of protection insulation films may be provided so as to cover only the top and side faces of the gate electrode 7, while a gate insulation film may be provided only right below the gate electrode 7 and in the vicinity of the gate electrode 7.

Note that the above-described embodiment has been described above as a variant of the first embodiment described above, this is not limiting and it may be configured as a variant of the above-described second, third or fourth embodiment.

Sixth Embodiment

A compound semiconductor device according to a sixth embodiment will be described with reference to FIGS. 9A to 9D.

The compound semiconductor device according to the present embodiment is different from that in the above-described first embodiment (see FIG. 1) in that a GaN-based semiconductor stacked structure 4 includes a cap layer 14, as depicted in FIG. 9D. In FIGS. 9A to 9D, the same elements as those in the above-described first embodiment (see FIG. 1) are referenced by the like reference symbols.

More specifically, in this MIS-type GaN-HEMT, the GaN-based semiconductor stacked structure 4 further includes a cap layer 14. In this embodiment, the cap layer 14 contacts the top of an electron supply layer (carrier supply layer) 3, and is a semiconductor layer having a lattice constant greater than that of the electron supply layer 3. The cap layer 14 is made thinner between the field plate 8 and the drain electrode 6 than in the vicinity of the gate electrode 7. Note that "the cap layer is made thinner" encompasses the situation where the thickness of the cap layer 14 is zero, in other words, no cap layer 14 is present. The cap layer 14 is also referred to as a semiconductor protection layer.

In this embodiment, a single n-GaN cap layer 14A is provided, as a cap layer 14, on the uppermost n-AlGaN electron supply layer 3 in the GaN-based semiconductor stacked structure 4. The n-GaN cap layer 14A is removed in a portion of the region between the field plate 8 and the drain electrode 6.

As described above, in this MIS-type GaN-HEMT, the GaN-based semiconductor stacked structure 4 includes a recess structure between the field plate 8 and the drain electrode 6.

By removing the n-GaN cap layer 14A having a lattice constant greater than that of the n-AlGaN electron supply layer 3 in the region between the field plate 8 and the drain electrode 6, as described above, the concentration of 2DEG, i.e., the carrier concentration, at this region can be increased. This helps to further suppress the current collapse phenomenon.

More specifically, in the presence of the n-GaN cap layer 14A, the band is raised under the influence of negative fixed charges due to piezo polarization, and the concentration of 2DEG, i.e., the carrier concentration, right below the n-GaN cap layer 14A is reduced. On the other hand, the higher the concentration of the 2DEG is compared to the concentration of the electrons trapped in the semiconductor surface and the like, the more effectively the current collapse phenomenon caused by electron trap can be suppressed. For the above reason, by removing the n-GaN cap layer 14A in a region between the field plate 8 and the drain electrode 6, the current collapse phenomenon is further suppressed by increasing the concentration of the 2DEG at this region.

In this embodiment, the n-GaN cap layer 14A and the gate insulation film 9 are not provided in a portion of the region between the field plate 8 and the drain electrode 6, such that the protection insulation film 10 contacts the n-AlGaN electron supply layer 3 exposed at the surface of the GaN-based semiconductor stacked structure 4. More specifically, an insulation film stacked structure constructed from the gate insulation film 9 and the protection insulation film 10 is provided on the n-GaN cap layer 14A exposed at the surface of the GaN-based semiconductor stacked structure 4 in the vicinity of the gate electrode 7. In contrast, only the protection insulation film 10 is provided on the n-AlGaN electron supply layer 3 exposed at the surface of the GaN-based semiconductor stacked structure 4, in a portion of the region between the field plate 8 and the drain electrode 6. Accordingly, an interface of the insulation films is present in the vicinity of the gate electrode 7, while no interface of the insulation films is present in the portion of the region between the field plate 8 and the drain electrode 6. As set forth above, the number of interfaces of the plurality of insulation films 9 and 10 is made smaller between the field plate 8 and the drain electrode 6 than in the vicinity of the gate electrode 7. In this configuration, the protection insulation film 10 contacts the GaN-based semiconductor stacked structure 4 between the field plate 8 and the drain electrode 6, whereas protection insulation film 10 contacts the gate insulation film 9 in the vicinity of the gate electrode 7.

Next, a method of manufacturing the MIS-type GaN-HEMT according to the present embodiment will be described.

Initially, in the manner similar to the above-described first embodiment, as depicted in FIG. 9A, over a semi-insulating SiC substrate 1, an i-GaN electron transit layer 2, an i-AlGaN spacer layer (not illustrated), and an n-AlGaN electron supply layer 3 are deposited, in sequence, with a MOVPE technique, for example. Thereafter, an n-GaN cap layer 14A (14) is further deposited on the n-AlGaN electron supply layer 3 to form a GaN-based semiconductor stacked structure 4.

The n-GaN cap layer 14A has a thickness of about 10 nm, and an Si dope concentration of about $5 \times 10^{18}$ cm$^{-3}$.

In the steps described above, the GaN-based semiconductor stacked structure 4 including the i-GaN electron transit layer 2, the n-AlGaN electron supply layer 3, and the n-GaN cap layer 14A is formed over the semi-insulating SiC substrate 1.

Next, in the manner similar to the above-described first embodiment, an AlO film (gate insulation film) 9 is formed on the entire surface.

Subsequently, in the manner similar to the above-described first embodiment, a resist mask (not illustrated) having respective openings in regions where source and drain electrodes are to be formed (hereinafter, the source and drain electrode formation regions), is formed.

Then, the AlO film 9 and the n-GaN cap layer 14A in the source and drain electrode formation regions are removed using this resist mask, with wet etching, or dry etching using a fluorine- or chlorine-based gas, or the like, for example. While the n-GaN cap layer 14A is removed entirely in the thickness direction in this embodiment, this is not limiting. For example, a portion of the n-GaN cap layer 14A may be removed in the thickness direction, or a portion of the n-AlGaN electron supply layer 3 may be removed in the thickness direction, in addition to removing the n-GaN cap layer 14A entirely in the thickness direction.

Subsequently, in the manner similar to the above-described first embodiment, a source electrode 5, a drain electrode 6, and a gate electrode 7 are formed.

Subsequently, in the manner similar to the above-described first embodiment, a resist mask (not illustrated) having an opening in a region (a partial region, in this example) between the field plate formation region and the drain electrode is formed, for example. Then, as depicted in FIGS. 9B and 9C, the AlO film 9 and the n-GaN cap layer 14A in the region between the field plate formation region and the drain electrode 6 are removed using this resist mask, with wet etching, or dry etching using a fluorine- or chlorine-based gas, or the like, for example. While the n-GaN cap layer 14A is removed entirely in the thickness direction in this embodiment, this is not limiting. For example, a portion of the n-GaN cap layer 14A may be removed in the thickness direction, or a portion of the n-AlGaN electron supply layer 3 may be removed in the thickness direction, in addition to removing the n-GaN cap layer 14A entirely in the thickness direction.

Thereafter, in the manner similar to the above-described first embodiment, as depicted in FIG. 9D, after forming an SiN film (protection insulation film) 10 on the entire surface, a field plate 8 is formed on the SiN film 10 between the gate and drain electrodes 7 and 6.

An MIS-type GaN-HEMT may be fabricated in the steps set forth above.

The other details are similar to those in the above-described first embodiment, and descriptions thereof will be omitted.

Accordingly, since trap of electrons at the interface of the plurality of insulation films 9 and 10 during a higher voltage operation is suppressed, the compound semiconductor device according to the present embodiment can suppress an increase in current collapse, which results in an increased on-resistance. More specifically, the compound semiconductor device according to the present embodiment provides an advantage in that the withstanding voltage is improved while suppressing any increase in the on-resistance, thereby achieving a compound semiconductor device with the two contradictory characteristics of a higher withstanding voltage and lower on-resistance.

Note that the variants of the above-described first embodiment may be applied to this embodiment described above.

That is, although the gate insulation film 9 is an AlO film and the protection insulation film 10 is an SiN film in the above-described embodiment, the materials for the insulation films are not limited to these particular materials. For example, an oxide, nitride or oxinitride of Ta, Ti, Si, Al, Hf, or Zr, may be used for these insulation films.

Furthermore, while the plurality of insulation films provided on the GaN-based semiconductor stacked structure 4 are made from different elements, i.e., the gate insulation film 9 is an AlO film and the protection insulation film 10 is an SiN film in the above-described embodiment, this is not limiting and they may be made from the same element.

Furthermore, while the n-GaN cap layer 14A is removed in a portion of the region between the field plate 8 and the drain electrode 6, such that the protection insulation film 10 contacts the surface of the GaN-based semiconductor stacked structure 4, i.e., the surface of the n-AlGaN electron supply layer 3 in the above-described embodiment, this is not limiting. The n-GaN cap layer 14A may be removed in at least a portion of the region between the field plate 8 and the drain electrode 6, such that the protection insulation film 10 contacts the surface of the GaN-based semiconductor stacked structure 4.

For example, the n-GaN cap layer 14A may be removed in the entire region between the field plate 8 and the drain electrode 6, such that the protection insulation film 10 contacts the surface of the GaN-based semiconductor stacked structure 4. More specifically, no n-GaN cap layer 14A may be provided in the entire region between the field plate 8 and the drain electrode 6, such that the surface of the GaN-based semiconductor stacked structure 4 is covered only with the protection insulation film 10. Furthermore, for example, the region wherein the protection insulation film 10 contacts the GaN-based semiconductor stacked structure 4, i.e., the region wherein the n-GaN cap layer 14A and the gate insulation film 9 are not provided, may extend from a region between the field plate 8 and the drain electrode 6 to a region below the field plate 8. Furthermore, for example, a plurality of protection insulation films may be provided. In this case, at least one protection insulation film other than the uppermost protection insulation film of the plurality of protection insulation films may be provided so as to cover only the top and side faces of the gate electrode 7, while a gate insulation film may be provided only right below the gate electrode 7 and in the vicinity of the gate electrode 7. In such a case, the n-GaN cap layer 14A may be provided only right below the gate electrode 7 and in the vicinity of the gate electrode 7, or may be removed in at least a portion of the region between the field plate 8 and the drain electrode 6.

Furthermore, while a single n-GaN cap layer 14A is provided as the cap layer 14 and the cap layer 14 (14A) is made thinner between the field plate 8 and the drain electrode 6 than in the vicinity of the gate electrode in the above-described embodiment, this is not limiting. For example, a cap layer 14 in multi-layered structure, wherein GaN-based semiconductor layers are stacked, may be provided, and the cap layer 14 may be made thinner between the field plate 8 and the drain electrode 6 than in the vicinity of the gate electrode 7.

Figure 10A:
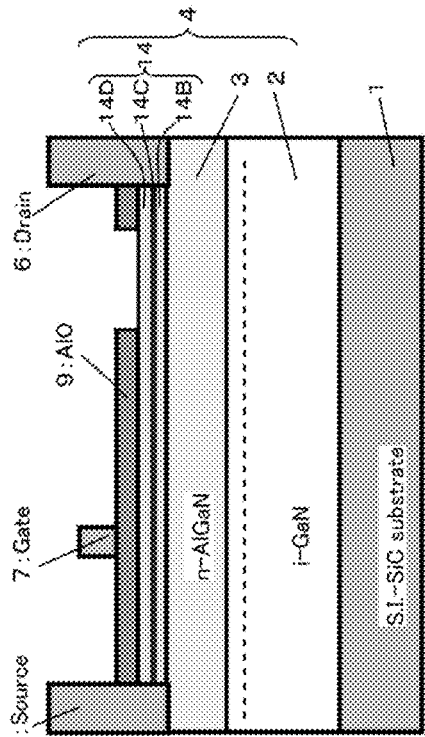
FIGS. 10A to 10D are schematic cross-sectional views illustrating a compound semiconductor device and a method of manufacturing the same according to a variant of the sixth embodiment.
Figure 10B:
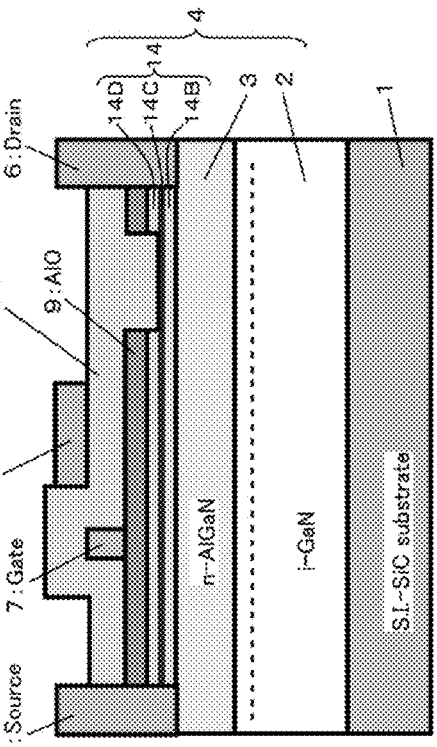
Figure 10C:
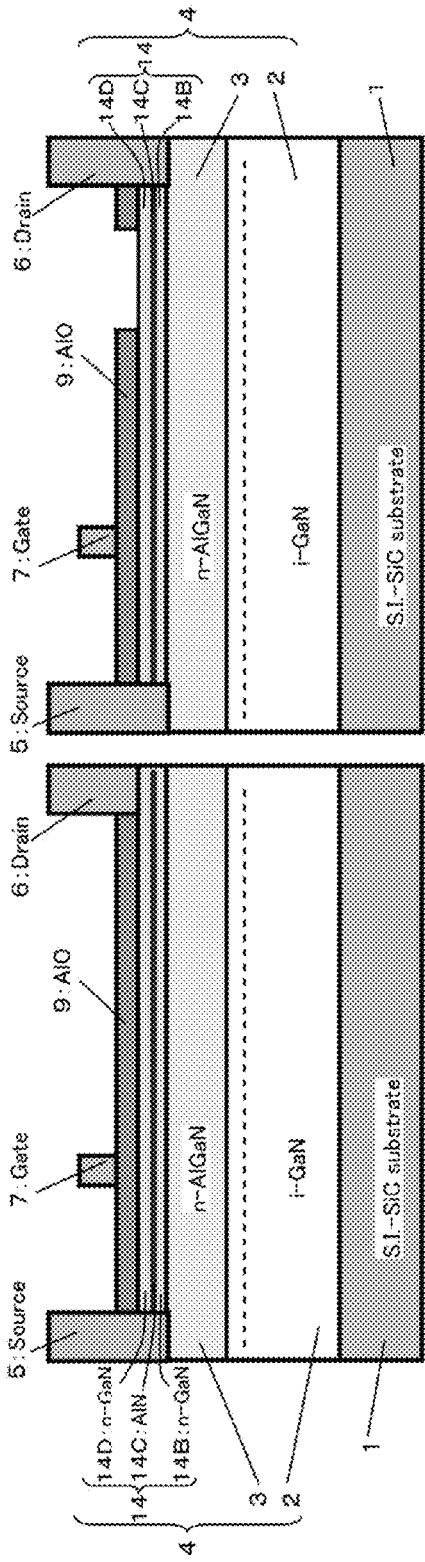
Figure 10D:
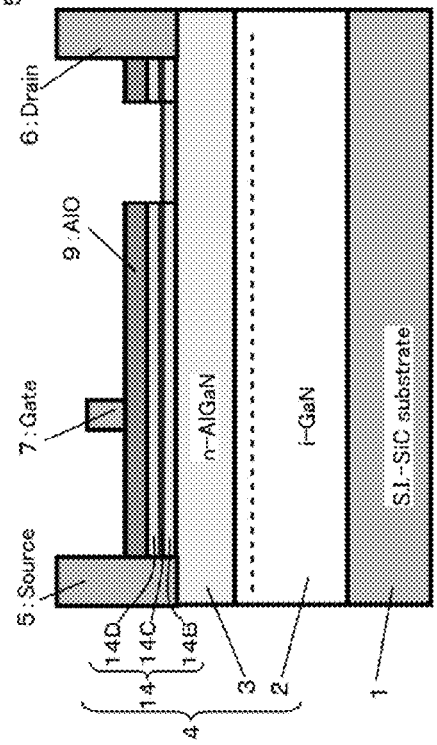

For example, as depicted in FIG. 10D, a cap layer 14 with a three-layered structure, wherein an n-GaN cap layer 14B, an i-AlN cap layer 14C, and an n-GaN cap layer 14D are stacked in sequence, may be provided as a cap layer, and the cap layer 14 may be made thinner between the field plate 8 and the drain electrode 6 than in the vicinity of the gate electrode 7.

In this case, the cap layer 14 with a three-layered structure, wherein the n-GaN cap layer 14B, the i-AlN cap layer 14C, and the n-GaN cap layer 14D are stacked, is provided, as a cap layer, on the uppermost n-AlGaN electron supply layer 3 in the GaN-based semiconductor stacked structure 4. The upper n-GaN cap layer 14D is removed in a portion of the region between the field plate 8 and the drain electrode 6.

Furthermore, since the upper cap layer is a GaN layer and the intermediate cap layer is an AlN layer in this example, the semiconductor material of the upper cap layer has a lattice constant greater than the lattice constant of the semiconductor material of the intermediate cap layer. More specifically, the lattice constant of the upper cap layer to be removed in a portion of the region between the field plate 8 and the drain electrode 6, as will be described later, is made greater than the lattice constant of the intermediate cap layer to be remained. Note that the intermediate cap layer, i.e., the i-AlN cap layer 14C is also referred to as a first semiconductor layer, while the upper cap layer, i.e., the n-GaN cap layer 14D is also referred to as a second semiconductor layer. Furthermore, the cap layer may include a first semiconductor layer and a second semiconductor layer contacting the top of the first semiconductor layer, and the second semiconductor layer may have a lattice constant greater than that of the first semiconductor layer.

By removing the upper n-GaN cap layer 14D having a lattice constant greater than that of the intermediate i-AlN cap layer 14C in a region between the field plate 8 and the drain electrode 6, as described above, the concentration of two-dimensional gas (2DEG), i.e., the carrier concentration, at this region can be increased. This helps to further suppress the current collapse phenomenon.

More specifically, in the presence of the upper n-GaN cap layer 14D, the band is raised under the influence of negative fixed charges due to piezo polarization, and the concentration of 2DEG, i.e., the carrier concentration, right below the upper n-GaN cap layer 14D is reduced. On the other hand, the higher the concentration of the 2DEG is compared to the concentration of the electrons trapped in the semiconductor surface and the like, the more effectively the current collapse phenomenon caused by electron trap can be suppressed. For the above reason, by removing the upper n-GaN cap layer 14D in the region between the field plate 8 and the drain electrode 6, the current collapse phenomenon is further suppressed by increasing the concentration of the 2DEG at this region.

In this case, the n-GaN cap layer 14D and the gate insulation film 9 are not provided in a portion of the region between the field plate 8 and the drain electrode 6, such that the protection insulation film 10 contacts the i-AlN cap layer 14C exposed at the surface of the GaN-based semiconductor stacked structure 4. More specifically, an insulation film stacked structure constructed from the gate insulation film 9 and the protection insulation film 10 is provided on the n-GaN cap layer 14D exposed at the surface of the GaN-based semiconductor stacked structure 4 in the vicinity of the gate electrode 7. In contrast, only the protection insulation film 10 is provided on the i-AlN cap layer 14C exposed at the surface of the GaN-based semiconductor stacked structure 4, in a portion of the region between the field plate 8 and the drain electrode 6. Accordingly, an interface of the insulation films is present in the vicinity of the gate electrode 7, while no interface of the insulation films is present in the portion of the region between the field plate 8 and the drain electrode 6. As set forth above, the number of interfaces of the plurality of insulation films 9 and 10 is made smaller between the field plate 8 and the drain electrode 6 than in the vicinity of the gate electrode 7. In this configuration, the protection insulation film 10 contacts the GaN-based semiconductor stacked structure 4 between the field plate 8 and the drain electrode 6, whereas protection insulation film 10 contacts the gate insulation film 9 in the vicinity of the gate electrode 7.

While the upper n-GaN cap layer 14D is removed between the field plate 8 and the drain electrode 6 is this case, this is not limiting. The upper n-GaN cap layer 14D may be made thinner between the field plate 8 and the drain electrode 6 than in the vicinity of the gate electrode 7. Note that "the upper n-GaN cap layer 14D (second semiconductor layer) is made thinner" encompasses the situation wherein the thickness of the upper n-GaN cap layer 14D (second semiconductor layer) is zero, in other words, no cap layer 14 is present.

While the cap layer 14 is made thinner between the field plate 8 and the drain electrode 6 than in the vicinity of the gate electrode 7 by removing the upper n-GaN cap layer 14D between the field plate 8 and the drain electrode 6, this is not limiting. For example, the cap layer 14 may be made thinner between the field plate 8 and the drain electrode 6 than in the vicinity of the gate electrode 7 by removing a cap layer 14 in a three-layered structure between the field plate 8 and the drain electrode 6. More specifically, a cap layer 14 in a three-layered structure wherein an n-GaN cap layer 14B, an i-AlN cap layer 14C, and an n-GaN cap layer 14D are stacked may be provided on the uppermost n-AlGaN electron supply layer 3 in the GaN-based semiconductor stacked structure 4, and the cap layer 14 may be removed between the field plate 8 and the drain electrode 6. This structure provides the same advantages as in the above-described embodiments, since the n-GaN cap layer 14B contacting the top of the n-AlGaN electron supply layer 3 and having a lattice constant greater than that of the n-AlGaN electron supply layer 3, is removed in a region between the field plate 8 and the drain electrode 6, in the manner similar to the above-described embodiment. Note that the lower cap layer, i.e., the n-GaN cap layer 14B is also referred to as a third semiconductor layer. Furthermore, the cap layer may include a first semiconductor layer, a second semiconductor layer contacting the top of the first semiconductor layer, and a third semiconductor layer contacting the top of the electron supply layer 3 (carrier supply layer), and the second semiconductor layer may have a lattice constant greater than that of the first semiconductor layer and the third semiconductor layer may have a lattice constant greater than that of the electron supply layer 3. Furthermore, the advantages similar to those of the variant of the above-described embodiment are provided, since the upper n-GaN cap layer 14D having a lattice constant greater than that of the intermediate i-AlN cap layer 14C is removed in a region between the field plate 8 and the drain electrode 6, in the similar manner as the variant of the above-described embodiment.

An MIS-type GaN-HEMT including a cap layer 14 in a three-layered structure as described above may be manufactured in the following processes.

More specifically, in the manner similar to the above-described embodiments, as depicted in FIG. 10A, over a semi-insulating SiC substrate 1, an i-GaN electron transit layer 2, an i-AlGaN spacer layer (not illustrated), and an n-AlGaN electron supply layer 3 are deposited, in sequence. Thereafter, an n-GaN cap layer 14B, an i-AlN cap layer 14C, and an n-GaN cap layer 14D are further deposited in sequence to form a GaN-based semiconductor stacked structure 4.

The n-GaN cap layer 14B has a thickness of about 10 nm, and an Si dope concentration of about $5 \times 10^{18}$ cm$^{-3}$. The i-AlN cap layer 14C has a thickness of about 2 nm. The n-GaN cap layer 14D has a thickness of about 10 nm, and an Si dope concentration of about $5 \times 10^{18}$ cm$^{-3}$.

In the steps described above, the GaN-based semiconductor stacked structure 4 including the i-GaN electron transit layer 2, the n-AlGaN electron supply layer 3, the n-GaN cap layer 14B, the i-AlN cap layer 14C, and the n-GaN cap layer 14D is formed over the semi-insulating SiC substrate 1.

Next, in the manner similar to the above-described embodiment, an AlO film (gate insulation film) 9 is formed on the entire surface.

Subsequently, in the manner similar to the above-described embodiment, a resist mask (not illustrated) having respective openings in regions where source and drain electrodes are to be formed (hereinafter, the source and drain electrode formation regions), is formed. Then, the AlO film 9, the n-GaN cap layer 14D, the i-AlN cap layer 14C, and the n-GaN cap layer 14B in the source and drain electrode formation regions are removed using this resist mask, with wet etching, or dry etching using a fluorine- or chlorine-based gas, or the like, for example. While the lower n-GaN cap layer 14B is removed entirely in the thickness direction in this embodiment, this is not limiting. For example, a portion of the lower n-GaN cap layer 14B may be removed in the thickness direction, or a portion of the n-AlGaN electron supply layer 3 may be removed in the thickness direction, in addition to removing the lower n-GaN cap layer 14B entirely in the thickness direction.

Subsequently, in the manner similar to the above-described embodiment, a source electrode 5, a drain electrode 6, and a gate electrode 7 are formed.

Subsequently, in the manner similar to the above-described embodiment, a resist mask (not illustrated) having an opening in a region (a partial region, in this example) between the field plate formation region and the drain electrode 6 is formed, for example. Then, as depicted in FIGS. 10B and 10C, the AlO film 10 and the upper n-GaN cap layer 14D at the region between the field plate formation region and the drain electrode 6 are removed using this resist mask, with wet etching, or dry etching using a fluorine- or chlorine-based gas, or the like, for example. While the upper n-GaN cap layer 14D is removed entirely in the thickness direction in this embodiment, this is not limiting. For example, a portion of the upper n-GaN cap layer 14D may be removed in the thickness direction, or a portion of the i-AlN cap layer may be removed in the thickness direction, in addition to removing the upper n-GaN cap layer 14D entirely in the thickness direction.

Thereafter, in the manner similar to the above-described embodiment, as depicted in FIG. 10D, after forming an SiN film (protection insulation film) 10 on the entire surface, a field plate 8 is formed on the SiN film 10 between the gate and drain electrodes 7 and 6.

An MIS-type GaN-HEMT may be fabricated in the steps set forth above.

Note that the above-described embodiment has been described above as a variant of the first embodiment described above, this is not limiting and it may be configured as a variant of the above-described second, third, fourth, or fifth embodiment.

Seventh Embodiment

A compound semiconductor device according to a seventh embodiment will be described with reference to FIGS. 11A to 11D.

The compound semiconductor device according to the present embodiment is similar to the above-described sixth embodiment (see FIGS. 9A to 9D) in that the cap layer 14 is made thinner in a region between the field plate 8 and the drain electrode 6 than in the vicinity of the gate electrode 7. However, the present embodiment is different in that a gate insulation film 9 is also provided on the GaN-based semiconductor stacked structure 4 at this region. The same elements in FIGS. 11A to 11D as in the above-described sixth embodiment (see FIGS. 9A to 9D) are referenced by the like reference symbols.

More specifically, in this MIS-type GaN-HEMT, a gate insulation film 9 is provided on the GaN-based semiconductor stacked structure 4, also in a portion of the region between the field plate 8 and the drain electrode 6, such that the gate insulation film 9 contacts the GaN-based semiconductor stacked structure 4. In other words, no n-GaN cap layer 14A is provided in a portion of the region between the field plate 8 and the drain electrode 6, such that the gate insulation film 9 contacts the n-AlGaN electron supply layer 3 exposed at the surface of the GaN-based semiconductor stacked structure 4. In such a case, although the number of interfaces of the plurality of insulation films 9 and 10 is not made smaller between the field plate 8 and the drain electrode 6 than in the vicinity of the gate electrode 7, the cap layer 14 is made thinner between the field plate 8 and the drain electrode 6 than in the vicinity of the gate electrode 7.

By removing the n-GaN cap layer 14A contacting the top of the n-AlGaN electron supply layer 3 and having a lattice constant greater than that of the n-AlGaN electron supply layer 3 in the region between the field plate 8 and the drain electrode 6, similarly to the above-described sixth embodiment, the concentration of 2DEG, i.e., the carrier concentration, at this region can be increased. This can suppress the current collapse phenomenon, thereby realizing a lower on-resistance.

For this purpose, this compound semiconductor device includes a GaN-based semiconductor stacked structure 4 including an i-GaN electron transit layer 2, an n-AlGaN electron supply layer 3, and an n-GaN cap layer 14A; a source electrode 5, a drain electrode 6, and a gate electrode 7 provided over the GaN-based semiconductor stacked structure 4; a field plate 8, at least a portion thereof being provided between the gate and drain electrodes 7 and 6; and a plurality of insulation films 9 and 10 formed over the GaN-based semiconductor stacked structure 4, wherein the n-GaN cap layer 14A (14) is made thinner between the field plate 8 and the drain electrode 6 than in the vicinity of the gate electrode 7. In this embodiment, the cap layer 14 contacts the top of an electron supply layer (carrier supply layer) 3, and is a semiconductor layer having a lattice constant greater than that of the electron supply layer 3.

Next, a method of manufacturing the MIS-type GaN-HEMT according to the present embodiment will be described.

Figure 11A:
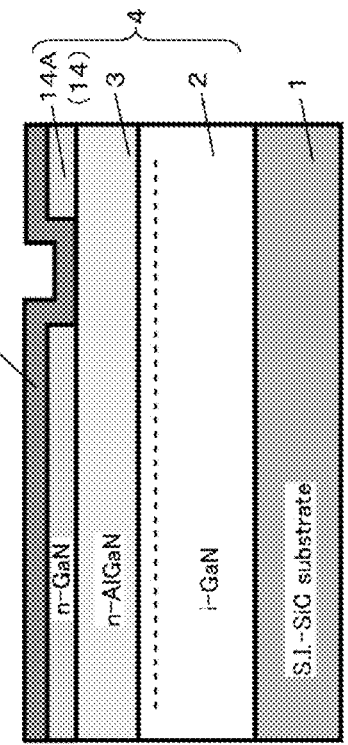
FIGS. 11A to 11D are schematic cross-sectional views illustrating the structure of a compound semiconductor device and a method of manufacturing the same according to a seventh embodiment.

Initially, in the manner similar to the above-described sixth embodiment, as depicted in FIG. 11A, over a semi-insulating SiC substrate 1, an i-GaN electron transit layer 2, an i-AlGaN spacer layer (not illustrated), an n-AlGaN electron supply layer 3, and an n-GaN cap layer 14A are deposited, in sequence, with a MOVPE technique, for example, to form a GaN-based semiconductor stacked structure 4.

In the steps described above, the GaN-based semiconductor stacked structure 4 including the i-GaN electron transit layer 2, the n-AlGaN electron supply layer 3, and the n-GaN cap layer 14A is formed over the semi-insulating SiC substrate 1.

Subsequently, a resist mask (not illustrated) having an opening in a region (a partial region, in this example) between the field plate formation region and the drain electrode formation region is formed, for example. The n-GaN cap layer 14A in the region between the field plate formation region and the drain electrode formation region is then removed using this resist mask, with dry etching using a chlorine-based gas or the like, for example. While the n-GaN cap layer 14A is removed entirely in the thickness direction in this embodiment, this is not limiting. For example, a portion of the n-GaN cap layer 14A may be removed in the thickness direction, or a portion of the n-AlGaN electron supply layer 3 may be removed in the thickness direction, in addition to removing the n-GaN cap layer 14A entirely in the thickness direction.

Figure 11B:
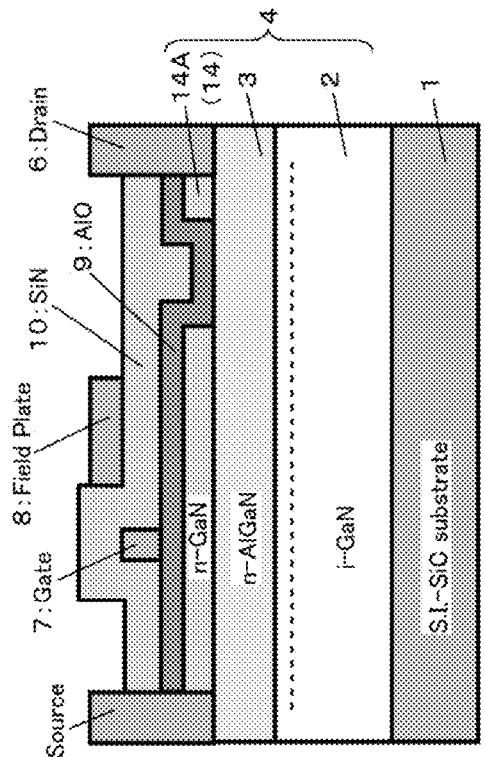

Next, in the manner similar to the above-described sixth embodiment, an AlO film (gate insulation film) 9 is formed on the entire surface, as depicted in FIG. 11B.

Figure 11C:
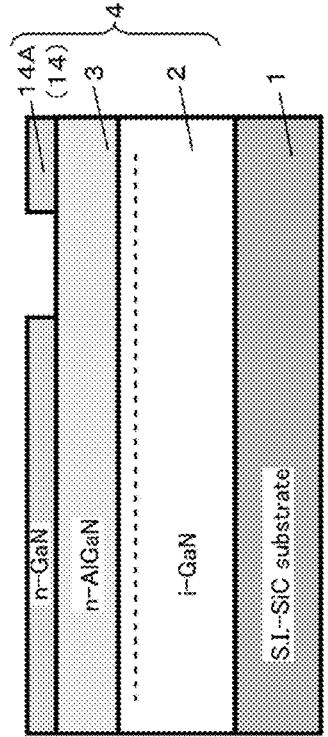

Subsequently, in the manner similar to the above-described sixth embodiment, a resist mask (not illustrated) having respective openings in regions where source and drain electrodes are to be formed (hereinafter, the source and drain electrode formation regions), is formed. Then, the AlO film 9 and the n-GaN cap layer 14A in the source and drain electrode formation regions are removed using this resist mask, with wet etching, or dry etching using a fluorine- or chlorine-based gas, or the like, for example, as depicted in FIG. 11C. While the n-GaN cap layer 14A is removed entirely in the thickness direction in this embodiment, this is not limiting. For example, a portion of the n-GaN cap layer 14A may be removed in the thickness direction, or a portion of the n-AlGaN electron supply layer 3 may be removed in the thickness direction, in addition to removing the n-GaN cap layer 14A entirely in the thickness direction.

Subsequently, in the manner similar to the above-described sixth embodiment, a source electrode 5, a drain electrode 6, and a gate electrode 7 are formed.

Figure 11D:
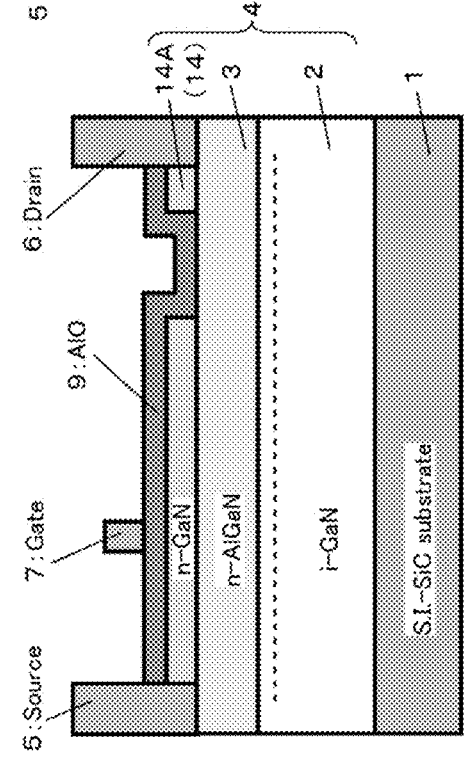

Thereafter, in the manner similar to the above-described sixth embodiment, as depicted in FIG. 11D, after forming an SiN film (protection insulation film) 10 on the entire surface, a field plate 8 is formed on the SiN film 10 between the gate and drain electrodes 7 and 6.

An MIS-type GaN-HEMT may be fabricated in the steps set forth above.

The other details are similar to those in the above-described first embodiment, and descriptions thereof will be omitted.

Accordingly, the compound semiconductor device according to the present embodiment provides an advantage in that the withstanding voltage is improved while suppressing any increase in the on-resistance, thereby achieving a compound semiconductor device with the two contradictory characteristics of a higher withstanding voltage and lower on-resistance.

Note that the variant of the above-described sixth embodiment may be applied to the MIS-type GaN-HEMT of the above-described embodiment.

That is, although the gate insulation film 9 is an AlO film and the protection insulation film 10 is an SiN film in the above-described embodiment, the materials for the insulation films are not limited to these particular materials. For example, an oxide, nitride or oxinitride of Ta, Ti, Si, Al, Hf, or Zr, may be used for these insulation films. Furthermore, while the plurality of insulation films provided on the GaN-based semiconductor stacked structure 4 are made from different elements, i.e., the gate insulation film 9 is an AlO film and the protection insulation film 10 is an SiN film in the above-described embodiment, this is not limiting and they may be made from the same element.

Furthermore, while the n-GaN cap layer 14A is removed in a portion of the region between the field plate 8 and the drain electrode 6, such that the gate insulation film 9 contacts the surface of the GaN-based semiconductor stacked structure 4, i.e., the surface of the n-AlGaN electron supply layer 3 in the above-described embodiment, this is not limiting. The n-GaN cap layer 14A may be removed in at least a portion of the region between the field plate 8 and the drain electrode 6, such that the gate insulation film 9 contacts the surface of the GaN-based semiconductor stacked structure 4.

For example, the n-GaN cap layer 14A may be removed in the entire region between the field plate 8 and the drain electrode 6, such that the gate insulation film 9 contacts the surface of the GaN-based semiconductor stacked structure 4. More specifically, no n-GaN cap layer 14A may be provided in the entire region between the field plate 8 and the drain electrode 6, such that the surface of the GaN-based semiconductor stacked structure 4 is covered with the gate insulation film 9. Furthermore, for example, the region wherein no n-GaN cap layer 14A is provided may extend from a region between the field plate 8 and the drain electrode 6 to a region below the field plate 8.

Furthermore, while a single n-GaN cap layer 14A is provided as the cap layer 14 and the cap layer 14 (14A) is made thinner between the field plate 8 and the drain electrode 6 than in the vicinity of the gate electrode in the above-described embodiment, this is not limiting. For example, a cap layer 14 in multi-layered structure, wherein GaN-based semiconductor layers are stacked, may be provided, and the cap layer 14 may be made thinner between the field plate 8 and the drain electrode 6 than in the vicinity of the gate electrode 7.

For example, similarly to the variant of the above-described sixth embodiment, as depicted in FIG. 12D, a cap layer 14 with a three-layered structure, wherein an n-GaN cap layer 14B, an i-AlN cap layer 14C, and an n-GaN cap layer 14D are stacked in sequence, may be provided as a cap layer, and the cap layer 14 may be made thinner between the field plate 8 and the drain electrode 6 than in the vicinity of the gate electrode 7. More specifically, a cap layer 14 in a three-layered structure wherein the n-GaN cap layer 14B, the i-AlN cap layer 14C, the n-GaN cap layer 14D are stacked is provided, as a cap layer, on the uppermost n-AlGaN electron supply layer 3 in the GaN-based semiconductor stacked structure 4, and the upper n-GaN cap layer 14D is removed in a portion of the region between the field plate 8 and the drain electrode 6. Note that the intermediate cap layer, i.e., the i-AlN cap layer 14C is also referred to as a first semiconductor layer, while the upper cap layer, i.e., the n-GaN cap layer 14D is also referred to a second semiconductor layer. Furthermore, the cap layer may include a first semiconductor layer and a second semiconductor layer contacting the top of the first semiconductor layer, and the second semiconductor layer may have a lattice constant greater than that of the first semiconductor layer.

In the manner similar to the variant of the above-described sixth embodiment, by removing the upper n-GaN cap layer 14D contacting the top of the intermediate i-AlN cap layer 14C and having a lattice constant greater than that of the intermediate i-AlN cap layer 14C, between the field plate 8 and the drain electrode 6, as described above, the concentration of two-dimensional gas (2DEG), i.e., the carrier concentration, at this region can be increased. This helps to further suppress the current collapse phenomenon.

While the upper n-GaN cap layer 14D is removed between the field plate 8 and the drain electrode 6 is this case, this is not limiting. The upper n-GaN cap layer 14D may be made thinner between the field plate 8 and the drain electrode 6 than in the vicinity of the gate electrode 7. Note that "the upper n-GaN cap layer 14D (second semiconductor layer) is made thinner" encompasses the situation wherein the thickness of the upper n-GaN cap layer 14D (second semiconductor layer) is zero, in other words, no cap layer 14 is present.

In this case, no n-GaN cap layer 14D is provided in a portion of the region between the field plate 8 and the drain electrode 6, such that the gate insulation film 9 contacts the i-AlN cap layer 14C exposed at the surface of the GaN-based semiconductor stacked structure 4. In such a case, although the number of interfaces of the plurality of insulation films 9 and 10 is not made smaller between the field plate 8 and the drain electrode 6 than in the vicinity of the gate electrode 7, the cap layer 14 is made thinner between the field plate 8 and the drain electrode 6 than in the vicinity of the gate electrode 7. Specifically, the upper n-GaN cap layer 14D (second semiconductor layer) is made thinner between the field plate 8 and the drain electrode 6 than in the vicinity of the gate electrode 7.

While the cap layer 14 is made thinner between the field plate 8 and the drain electrode 6 than in the vicinity of the gate electrode 7 by removing the upper n-GaN cap layer 14D between the field plate 8 and the drain electrode 6, this is not limiting. For example, the cap layer 14 is made thinner between the field plate 8 and the drain electrode 6 than in the vicinity of the gate electrode 7 by removing the cap layer 14 in a three-layered structure between the field plate 8 and the drain electrode 6. More specifically, a cap layer 14 in a three-layered structure wherein the n-GaN cap layer 14B, the i-AlN cap layer 14C, the n-GaN cap layer 14D are stacked may be provided on the uppermost n-AlGaN electron supply layer 3 in the GaN-based semiconductor stacked structure 4, and the cap layer 14 may be removed between the field plate 8 and the drain electrode 6. This structure provides the same advantages as in the above-described embodiments, since the n-GaN cap layer 14B contacting the top of the n-AlGaN electron supply layer 3 and having a lattice constant greater than that of the n-AlGaN electron supply layer 3, is removed in a region between the field plate 8 and the drain electrode 6, in the manner similar to the above-described embodiment. Note that the lower cap layer, i.e., the n-GaN cap layer 14B is also referred to as a third semiconductor layer. Furthermore, the cap layer may include a first semiconductor layer, a second semiconductor layer contacting the top of the first semiconductor layer, and a third semiconductor layer contacting the top of the electron supply layer 3 (carrier supply layer), and the second semiconductor layer may have a lattice constant greater than that of the first semiconductor layer and the third semiconductor layer may have a lattice constant greater than that of the electron supply layer 3. Furthermore, the advantages similar to those of the variant of the above-described embodiment are provided, since the upper n-GaN cap layer 14D having a lattice constant greater than that of the intermediate i-AlN cap layer 14C is removed in a region between the field plate 8 and the drain electrode 6, in the similar manner as the variant of the above-described embodiment.

An MIS-type GaN-HEMT including a cap layer 14 in a three-layered structure as described above may be manufactured in the following processes.

More specifically, in the manner similar to the variant of the above-described sixth embodiment, as depicted in FIG. 12A, over a semi-insulating SiC substrate 1, an i-GaN electron transit layer 2, an i-AlGaN spacer layer (not illustrated), and an n-AlGaN electron supply layer 3 are deposited, in sequence. Thereafter, an n-GaN cap layer 14B, an i-AlN cap layer 14C, and an n-GaN cap layer 14D are further deposited in sequence to form a GaN-based semiconductor stacked structure 4.

In the steps described above, the GaN-based semiconductor stacked structure 4 including the i-GaN electron transit layer 2, the n-AlGaN electron supply layer 3, the n-GaN cap layer 14B, the i-AlN cap layer 14C, and the n-GaN cap layer 14D is formed over the semi-insulating SiC substrate 1.

Next, in the manner similar to the above-described embodiment, the upper n-GaN cap layer 14D in a region (a partial region, in this example) between the field plate formation region and the drain electrode formation region is removed. While the upper n-GaN cap layer 14D is removed entirely in the thickness direction in this embodiment, this is not limiting. For example, a portion of the upper n-GaN cap layer 14D may be removed in the thickness direction, or a portion of the i-AlN cap layer 14C may be removed in the thickness direction, in addition to removing the upper n-GaN cap layer 14D entirely in the thickness direction.

Next, in the manner similar to the above-described embodiment, an AlO film (gate insulation film) 9 is formed on the entire surface, as depicted in FIG. 12B.

Subsequently, in the manner similar to the variant of the above-described sixth embodiment, as depicted in FIG. 12C, the AlO film 9, the n-GaN cap layer 14D, the i-AlN cap layer 14C, and the n-GaN cap layer 14B are removed in the source and drain electrode formation regions.

Subsequently, in the manner similar to the above-described embodiment, a source electrode 5, a drain electrode 6, and a gate electrode 7 are formed.

Thereafter, in the manner similar to the above-described embodiment, as depicted in FIG. 12D, after forming an SiN film (protection insulation film) 10 on the entire surface, a field plate 8 is formed on the SiN film 10 between the gate and drain electrodes 7 and 6.

An MIS-type GaN-HEMT may be fabricated in the steps set forth above.

Eighth Embodiment

A compound semiconductor device according to an eighth embodiment will be described with reference to FIGS. 13A to 13D.

The above-described first embodiment (see FIG. 1) increases the number of interfaces of insulation films for suppressing the electron trap at the interface of the insulation films during a higher voltage operation. This embodiment is different in that the interfaces of the insulation films are placed farther from the surface of nitride semiconductor stacked structure.

Figure 13A:
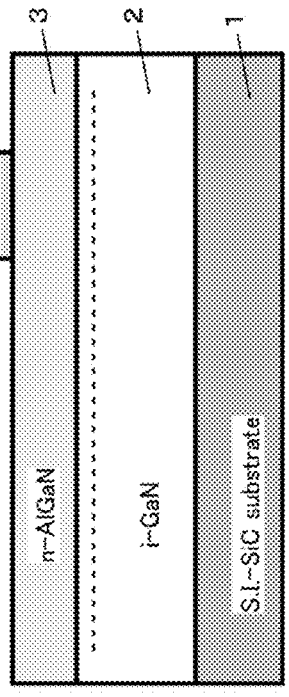
FIGS. 13A to 13D are schematic cross-sectional views illustrating the structure of a compound semiconductor device and a method of manufacturing the same according to an eighth embodiment.
Figure 13B:
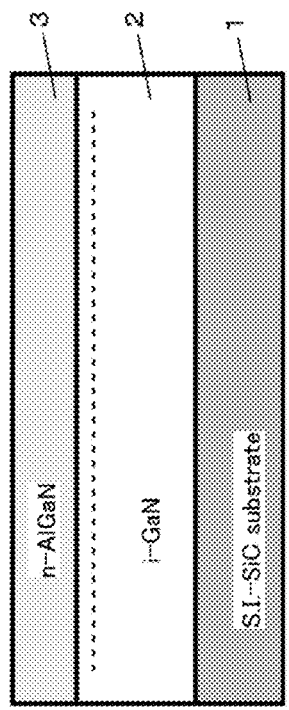
Figure 13C:
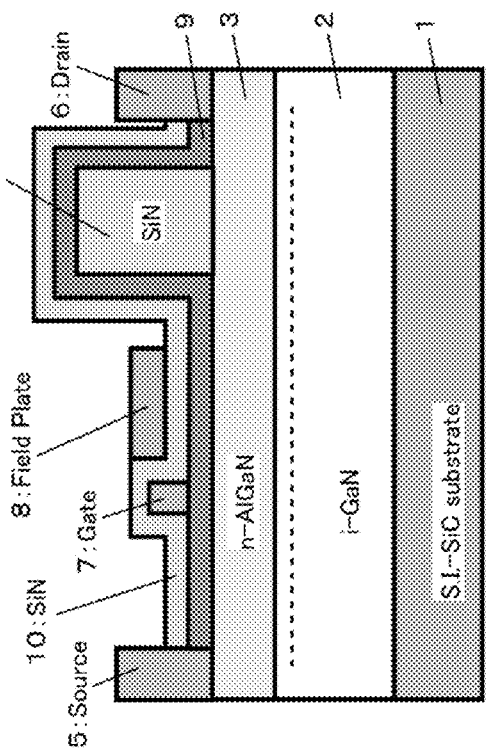
Figure 13D:
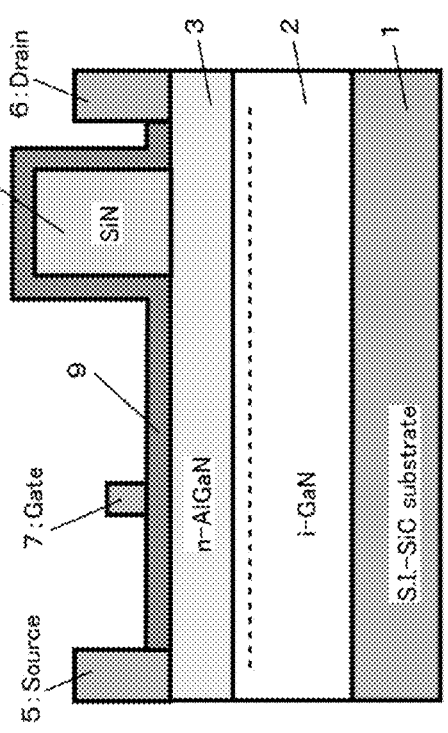

For this purpose, this MIS-type GaN-HEMT includes a gate insulation film 9 provided between a GaN-based semiconductor stacked structure 4 and a gate electrode 7, and a protection insulation film 10 covering the surface, as a plurality of insulation films, as depicted in FIG. 13D, and further includes an insulation film 15 placed between a field plate 8 and a drain electrode 6 and contacting the GaN-based semiconductor stacked structure 4. This embodiment includes the insulation film 15 between the GaN-based semiconductor stacked structure 4 and the gate insulation film 9, in a portion or all of the region between the field plate 8 and the drain electrode 6. In this manner, the surface of the GaN-based semiconductor stacked structure 4 is covered with a structure wherein the two insulation films 9 and 10 are stacked in the vicinity of the gate electrode 7, while being covered with another structure wherein the three insulation films 9, 10, and 15 are stacked between the field plate 8 and the drain electrode 6. Note that the protection insulation film 10 is also referred to as an upper insulation film. The insulation film 15 is also referred to as a protection insulation film or a lower insulation film. In FIGS. 13A to 13D, the same elements as those in the above-described first embodiment (see FIG. 1) are referenced by the like reference symbols.

The insulation film 15 is made thicker than the total film thickness of the gate insulation film 9 and the protection insulation film 10. More specifically, the insulation film 15 placed between the field plate 8 and the drain electrode 6 and contacting the GaN-based semiconductor stacked structure 4 is made thicker than the total film thickness of the insulation films 9 and 10 located between the field plate 8 and the GaN-based semiconductor stacked structure 4.

In this embodiment, the insulation film 15 covers the surface of the GaN-based semiconductor stacked structure 4. In this embodiment, the insulation film 15 is an SiN film, for example.

In this embodiment, the gate insulation film 9 covers the surfaces of the GaN-based semiconductor stacked structure 4 and the insulation film 15, and extends from right below the gate electrode 7 to the source electrode 5 and to the drain electrode 6. In this embodiment, the gate insulation film 9 is an AlO film, for example.

The protection insulation film 10 covers the surfaces of the gate electrode 7 and the gate insulation film 9, and extends from above the gate electrode 7 to the source electrode 5 and to the drain electrode 6. In this embodiment, the protection insulation film 10 is an SiN film, for example.

As described above, in this MIS-type GaN-HEMT, by providing the insulation film 15 between the GaN-based semiconductor stacked structure 4 and the gate insulation film 9 in a portion or all of the region between the field plate 8 and the drain electrode 6, the interfaces of insulation films between the field plate 8 and the drain electrode 6 are placed farther from the surface of the GaN-based semiconductor stacked structure 4. This configuration can suppress trap of the electrons at the interface of the plurality of insulation films 9, 10, and 15 during a higher voltage operation. In other words, the trap density at the interfaces of the plurality of insulation films 9, 10, and 15 during a higher voltage operation can be reduced. Furthermore, the adverse effects of electrons trapped at the interfaces of the plurality of insulation films 9, 10, and 15 can be reduced.

Next, a method of manufacturing the MIS-type GaN-HEMT according to the present embodiment will be described.

Initially, in the manner similar to the above-described first embodiment, as depicted in FIG. 13A, over a semi-insulating SiC substrate 1, an i-GaN electron transit layer 2, an i-AlGaN spacer layer (not illustrated), and an n-AlGaN electron supply layer 3 are deposited, in sequence, to form a GaN-based semiconductor stacked structure 4. In the steps described above, the GaN-based semiconductor stacked structure 4 including the i-GaN electron transit layer 2 and the n-AlGaN electron supply layer 3 is formed over the semi-insulating SiC substrate 1.

Next, as depicted in FIG. 13B, an SiN film (insulation film) 15 is formed in a region (a partial region, in this example) between the field plate formation region and the drain electrode formation region. In this embodiment, the SiN layer 15 has a thickness of about 1 µm.

More specifically, after forming the SiN film on the entire surface with a plasma CVD technique, for example, a resist mask (not illustrated) is formed in a region between the field plate formation region and the drain electrode formation region with photolithography, for example. The SiN film other than the region between the field plate formation region and the drain electrode formation region is then removed using this resist mask, for example, with wet or dry etching, or the like, to form an SiN film 15.

Next, in the manner similar to the above-described first embodiment, an AlO film (gate insulation film) 9 is formed on the entire surface, as depicted in FIG. 13C. In this embodiment, the AlO film 9 has a thickness of about 50 nm.

Subsequently, in the manner similar to the above-described first embodiment, after removing the AlO film 9 in the source and drain electrode formation regions, source and drain electrodes 5 and 6 are formed.

Next, in the manner similar to the above-described first embodiment, a gate electrode 7 is formed on the AlO film 9 in the gate electrode formation region.

Subsequently, in the manner similar to the above-described first embodiment, as depicted in FIG. 13D, an SiN film (protection insulation film) 10 is formed on the entire surface. In this embodiment, the SiN film 10 has a thickness of about 200 nm.

Subsequently, a field plate 8 is formed on the SiN film 10 between the gate and drain electrodes 7 and 6.

An MIS-type GaN-HEMT may be fabricated in the steps set forth above.

The other details are similar to those in the above-described first embodiment, and descriptions thereof will be omitted.

Accordingly, since trap of electrons at the interface of the plurality of insulation films 9, 10, and 15 during a higher voltage operation is suppressed and the adverse effects of the electrons trapped at the interfaces of the plurality of insulation films 9, 10, and 15 can be reduced, the compound semiconductor device according to the present embodiment can suppress an increase in current collapse, which results in an increased on-resistance. More specifically, the compound semiconductor device according to the present embodiment provides an advantage in that the withstanding voltage is improved while suppressing any increase in the on-resistance, which achieves a compound semiconductor device having the two contradictory characteristics of a higher withstanding voltage and lower on-resistance.

Note that the variants of the above-described first embodiment may be applied to this embodiment described above.

That is, although the insulation film 15 is an SiN film, the gate insulation film 9 is an AlO film, and the protection insulation film 10 is an SiN film in the above-described embodiment, the materials for the insulation films are not limited to these particular materials. For example, an oxide, nitride or oxinitride of Ta, Ti, Si, Al, Hf, or Zr, may be used for these insulation films. Furthermore, while the insulation films are made from different elements, i.e., the gate insulation film 9 is an AlO film, the insulation film 15 and protection insulation film 10 are SiN films, in the above-described embodiment, this is not limiting and they may be made from the same element.

Furthermore, the gate insulation film 9 and the protection insulation film 10 are provided as insulation films located between the field plate 8 and the GaN-based semiconductor stacked structure 4 in the above-described embodiment, this is not limiting. For example, a gate insulation film 9 may be provided between the nitride semiconductor stacked structure 4 and the gate electrode 7, as a insulation film located between the field plate 8 and the GaN-based semiconductor stacked structure 4. In other words, the above-described eighth embodiment may be combined with the fourth embodiment.

Note that the above-described embodiment has been described above as a variant of the first embodiment described above, this is not limiting and it may be configured as a variant of the above-described second, third, fourth, fifth, sixth, or seventh embodiment.

Others

Note that the present disclosure is not limited to the specific configurations of the embodiments and their variants set forth above, and may be modified in various manners without departing from the sprit of the present disclosure.

For example, the compound semiconductor stacked structure constructing a compound semiconductor device of any of the above-described embodiments and their variants is not limited to the nitride semiconductor stacked structures in the above-described embodiments and their variants, and other nitride semiconductor stacked structures may also be used. For example, any suitable nitride semiconductor stacked structures capable of constructing a MIS-type transistor having a gate insulation film may be used. For example, a nitride semiconductor stacked structure which may be used to construct a field-effect transistor, such as a field-effect transistor using a nitride semiconductor, may be used. Note that a nitride semiconductor stacked structure is also referred to as a semiconductor epitaxial structure.

Furthermore, while a SiC substrate is used in the above-described embodiments and their variants, this is not limiting. For example, other substrates, including a sapphire substrate or semiconductor substrates such as a Si substrate and a GaAs substrate, may also be used. Furthermore, while a semi-insulating substrate is used in the above-described embodiments and their variants, this is not limiting. For example, a substrate with n-type or p-type conductivity may also be used.

Furthermore, the layer structures of the source, drain, and gate electrodes in the above-described embodiments and their variants are not limited to the specific layer structures in the embodiments and their variants described above, and any other layer structures may also be used. For example, the layer structures of the source, drain, and gate electrodes in the above-described embodiments and their variants may be single-layered or multi-layered. Furthermore, the techniques of forming the source, drain, and gate electrodes in the above-described embodiments and their variants are only exemplary, and any other techniques may also be used.

Furthermore, for example, while an annealing process is performed for establishing the ohmic contact characteristics of the source and drain electrodes in the above-described embodiments and their variants, this is not limiting. An annealing process is performed for establishing the ohmic contact characteristics of the source and drain electrodes may be omitted, as long as the ohmic contact characteristics can be established without an annealing process. Furthermore, while the gate electrode undergoes no annealing process in the above-described embodiments and their variants, an annealing process may be performed on the gate electrode.

All examples and conditional language recited here in are intended for pedagogical purposes to aid the reader in understanding the invention and the concepts contributed by the inventor to furthering the art, and are to be construed as being without limitation to such For example recited examples and conditions, nor does the organization of such examples in the specification relate to a illustrating of the superiority and inferiority of the invention. Although the embodiments have been described in detail, it should be understood that the various changes, substitutions, and alterations could be made hereto without departing from the spirit and scope of the invention.

What is claimed is:

1. A compound semiconductor device comprising:
a nitride semiconductor stacked structure comprising a carrier transit layer and a carrier supply layer;
a source electrode and a drain electrode provided over the nitride semiconductor stacked structure;
a gate electrode provided between the source electrode and the drain electrode, over the nitride semiconductor stacked structure;
a field plate provided at least partially between the gate electrode and the drain electrode; and
a plurality of insulation films formed over the nitride semiconductor stacked structure,
wherein the plurality of insulation films include a gate insulation film provided between the nitride semiconductor stacked structure and the gate electrode and a protection insulation film covering a surface, and the protection insulation film directly contacts the nitride semiconductor stacked structure between the field plate and the drain electrode, and contacts the gate insulation film in the vicinity of the gate electrode.

2. The compound semiconductor device according to claim 1, wherein the protection insulation film comprises a plurality of protection insulation films, and an uppermost protection insulation film of the plurality of protection insulation films contacts the nitride semiconductor stacked structure between the field plate and the drain electrode, and a lowermost protection insulation film of the plurality of protection insulation films contacts the gate insulation film in the vicinity of the gate electrode.

3. The compound semiconductor device comprising:
a nitride semiconductor stacked structure comprising a carrier transit layer and a carrier supply layer;
a source electrode and a drain electrode provided over the nitride semiconductor stacked structure;
a gate electrode provided between the source electrode and the drain electrode, over the nitride semiconductor stacked structure;
a field plate provided at least partially between the gate electrode and the drain electrode; and
a plurality of insulation films formed over the nitride semiconductor stacked structure,
wherein the plurality of insulation films include a gate insulation film provided between the nitride semiconductor stacked structure and the gate electrode and a protection insulation film covering a surface, and
the protection insulation film comprises a plurality of protection insulation films, and an uppermost protection insulation film of the plurality of protection insulation films contacts the gate insulation film between the field plate and the drain electrode, and a lowermost protection insulation film of the plurality of protection insulation films contacts the gate insulation film in the vicinity of the gate electrode.

4. A compound semiconductor device comprising:
a nitride semiconductor stacked structure comprising a carrier transit layer and a carrier supply layer;
a source electrode and a drain electrode provided over the nitride semiconductor stacked structure;
a gate electrode provided between the source electrode and the drain electrode, over the nitride semiconductor stacked structure;
a field plate provided at least partially between the gate electrode and the drain electrode; and
a plurality of insulation films formed over the nitride semiconductor stacked structure,
wherein a film thickness of an insulation film of the plurality of insulation films, which is located between the field plate and the drain electrode and contacts the nitride semiconductor stacked structure, is greater than a total film thickness of insulation films located between the field plate and the nitride semiconductor stacked structure,
wherein the insulation film located between the field plate and the nitride semiconductor stacked structure comprises a gate insulation film provided between the nitride semiconductor stacked structure and the gate electrode, and a protection insulation film covering a surface.

5. The compound semiconductor device according to claim 4, wherein the nitride semiconductor stacked structure further comprises a cap layer, and the cap layer is made thinner between the field plate and the drain electrode than in the vicinity of the gate electrode.

6. The compound semiconductor device according to claim 5, wherein the cap layer is a semiconductor layer which contacts an upper side of the carrier supply layer, and has a lattice constant greater than that of the carrier supply layer.

7. The compound semiconductor device according to claim 5, wherein the cap layer comprises a first semiconductor layer, and a second semiconductor layer contacting an upper side of the first semiconductor layer, and the second semiconductor layer has a lattice constant greater than that of the first semiconductor layer.

8. A compound semiconductor device comprising:
- a nitride semiconductor stacked structure comprising a carrier transit layer, a carrier supply layer, and a cap layer;
- a source electrode and a drain electrode provided over the nitride semiconductor stacked structure;
- a gate electrode provided between the source electrode and the drain electrode, over the nitride semiconductor stacked structure;
- a field plate provided at least partially between the gate electrode and the drain electrode; and
- a plurality of insulation films formed over the nitride semiconductor stacked structure,
- wherein the cap layer is made thinner between the field plate and the drain electrode than in the vicinity of the gate electrode.

9. The compound semiconductor device according to claim 8, wherein the cap layer is a semiconductor layer which contacts an upper side of the carrier supply layer, and has a lattice constant greater than that of the carrier supply layer.

10. The compound semiconductor device according to claim 8, wherein the cap layer comprises a first semiconductor layer, and a second semiconductor layer contacting an upper side of the first semiconductor layer, and the second semiconductor layer has a lattice constant greater than that of the first semiconductor layer.

* * * * *